(12) United States Patent
Choi et al.

(10) Patent No.: US 12,254,833 B2
(45) Date of Patent: Mar. 18, 2025

(54) DISPLAY DEVICE HAVING POWER LINE OVERLAPPING WITH GATE ELECTRODE OF DRIVING TRANSISTOR

(71) Applicant: SAMSUNG DISPLAY CO., LTD., Yongin-si (KR)

(72) Inventors: Jun Won Choi, Yongin-si (KR); Jun Yong An, Yongin-si (KR); Yun Kyeong In, Yongin-si (KR); Won Mi Hwang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 9 days.

(21) Appl. No.: 17/509,363

(22) Filed: Oct. 25, 2021

(65) Prior Publication Data

US 2022/0044637 A1   Feb. 10, 2022

Related U.S. Application Data

(63) Continuation of application No. 16/798,888, filed on Feb. 24, 2020, now Pat. No. 11,158,263, which is a (Continued)

(30) Foreign Application Priority Data

Feb. 1, 2017   (KR) .......................... 10-2017-0014441

(51) Int. Cl.
*G09G 3/3258* (2016.01)
*G09G 3/3233* (2016.01)
(Continued)

(52) U.S. Cl.
CPC ......... *G09G 3/3258* (2013.01); *G09G 3/3233* (2013.01); *G09G 3/3291* (2013.01);
(Continued)

(58) Field of Classification Search
CPC .................................................. G09G 3/3258
(Continued)

(56) References Cited

U.S. PATENT DOCUMENTS 8,730,132 B2   5/2014   Choi et al.
8,952,877 B2   2/2015   Kim et al.
(Continued)

FOREIGN PATENT DOCUMENTS

CN   101354510 A   1/2009
CN   103165078 A   6/2013
(Continued)

*Primary Examiner* — Long D Pham
(74) *Attorney, Agent, or Firm* — CANTOR COLBURN LLP

(57) ABSTRACT

A display device includes: a plurality of pixels substantially in a matrix form including a plurality of pixel columns in a first direction and a plurality of pixel rows in a second direction intersecting the first direction; a plurality of data lines connected to the pixel columns, respectively; a plurality of scan lines extending in the second direction; and a power line which supplies a driving power voltage to the pixels. Each of the data lines includes a first sub-data line disposed at a side of a corresponding pixel column, and a second sub-data line disposed at an opposite side of the corresponding pixel column, and each of the pixels includes a first transistor and a display element connected to the first transistor, where the power line overlaps with at least a portion of the first transistor.

20 Claims, 14 Drawing Sheets

Related U.S. Application Data continuation of application No. 15/880,026, filed on Jan. 25, 2018, now Pat. No. 10,573,243.

(51) Int. Cl.
   *G09G 3/3291* (2016.01)
   *H10K 50/805* (2023.01)
   *H10K 59/131* (2023.01)

(52) U.S. Cl.
   CPC ......... *H10K 50/805* (2023.02); *H10K 59/131* (2023.02); *G09G 2300/0861* (2013.01); *G09G 2310/0251* (2013.01); *G09G 2310/0262* (2013.01); *G09G 2310/0297* (2013.01)

(58) Field of Classification Search
   USPC .......................................................... 345/76
   See application file for complete search history.

(56) References Cited

U.S. PATENT DOCUMENTS

| | | | |
|---|---|---|---|
| 9,285,643 B2 | 3/2016 | Song et al. | |
| 9,324,777 B2 | 4/2016 | Kang et al. | |
| 9,349,316 B2 | 5/2016 | Kim et al. | |
| 9,812,082 B2 | 11/2017 | Chen et al. | |
| 2007/0057877 A1* | 3/2007 | Choi | G09G 3/3291 |
| | | | 345/76 |
| 2009/0166638 A1 | 7/2009 | Honda | |
| 2012/0104401 A1 | 5/2012 | Kubota et al. | |
| 2012/0126422 A1 | 5/2012 | Endo et al. | |
| 2013/0106817 A1 | 5/2013 | Gang et al. | |
| 2013/0271440 A1* | 10/2013 | Jin | G09G 3/3233 |
| | | | 345/76 |
| 2015/0009106 A1 | 1/2015 | Lee et al. | |
| 2015/0060843 A1 | 3/2015 | Lee et al. | |
| 2015/0061983 A1* | 3/2015 | Kim | G09G 3/3275 |
| | | | 345/82 |
| 2015/0379930 A1 | 12/2015 | Lee et al. | |
| 2016/0211273 A1* | 7/2016 | Moon | H01L 27/3244 |
| 2016/0307981 A1* | 10/2016 | Jung | H01L 27/3262 |
| 2016/0321996 A1* | 11/2016 | Lee | G09G 3/3233 |
| 2017/0025492 A1* | 1/2017 | Jung | H10K 59/1213 |
| 2017/0076667 A1* | 3/2017 | Numata | G09G 3/3266 |
| 2017/0140706 A1* | 5/2017 | Song | G09G 3/3233 |
| 2017/0221979 A1 | 8/2017 | Chae | |
| 2018/0190750 A1 | 7/2018 | Choi et al. | |

FOREIGN PATENT DOCUMENTS

| | | |
|---|---|---|
| CN | 104282720 A | 1/2015 |
| CN | 104465715 A | 3/2015 |
| KR | 100666646 B1 | 1/2007 |
| KR | 1020120010824 A | 2/2012 |
| KR | 1020150028088 A | 3/2015 |
| KR | 1020180080741 A | 7/2018 |

* cited by examiner

DISPLAY DEVICE HAVING POWER LINE OVERLAPPING WITH GATE ELECTRODE OF DRIVING TRANSISTOR

The present application is a continuation of U.S. patent application Ser. No. 16/798,888, filed on Feb. 24, 2020, which is a continuation of U.S. patent application Ser. No. 15/880,026, filed on Jan. 25, 2018, which claims priority to Korean Patent Application No. 10-2017-0014441, filed on Feb. 1, 2017, and all the benefits accruing therefrom under 35 U.S.C. § 119i, the content of which in its entirety is herein incorporated by reference.

BACKGROUND

1. Field

Embodiments of the disclosure relate to a display device.

2. Description of the Related Art

An organic light emitting display device typically includes two electrodes and an organic emitting layer located between the two electrodes. In the organic light emitting display device, electrons injected from one electrode and holes injected from the other electrode are combined in the organic emitting layer to form excitons, and the excitons emit light through energy emission.

The organic light emitting display device includes a plurality of pixels each including a display element, e.g., an organic light emitting diode. A plurality of thin film transistors that are connected to lines and drive the organic light emitting diode may be provided in each pixel.

SUMMARY

In an organic light emitting display device, undesired parasitic capacitor, which deteriorates the display quality of the organic light emitting display device, may be formed between a line unit and the thin film transistors.

Embodiments of the invention provide a display device having improved display quality by effectively preventing the formation of a parasitic capacitor.

According to an embodiment of the disclosure, a display device includes: a plurality of pixels including a plurality of pixels arranged along a first direction, the pixel columns arranged along a second direction intersecting the first direction; a plurality of data lines connected to the pixel columns, respectively; a plurality of scan lines extending in the second direction; and a power line which supplies a driving power voltage to the pixels. In such an embodiment, each of the data lines includes a first sub-data line disposed at a side of a corresponding pixel column, and a second sub-data line disposed at an opposite side of the corresponding pixel column, and each of the pixels includes a first transistor and a display element connected to the first transistor, where the power line overlaps with at least a portion of the first transistor.

In an embodiment, the power line may be disposed between the first sub-data line and the second sub-data line.

In an embodiment, the first transistor may include: an active pattern disposed on a substrate; a source electrode connected to the active pattern; a drain electrode connected to the active pattern; a gate electrode overlapping with the active pattern with a gate insulating layer interposed therebetween; and an interlayer insulating layer including a first interlayer insulating layer, a second interlayer insulating layer and a third interlayer insulating layer, where the first interlayer insulating layer, the second interlayer insulating layer and the third interlayer insulating layer may cover the gate electrode and be sequentially stacked one on another.

In an embodiment, the power line may include: a first power supply line disposed on the second interlayer insulating layer; and a second power supply line disposed on the third interlayer insulating layer, where the second power supply line is electrically connected to the first power supply line.

In an embodiment, the power line may further include an extension region having a shape extending from the second power supply line.

In an embodiment, the extension region may overlap with the gate electrode.

In an embodiment, the data lines may be disposed in a same layer as the first power supply line.

In an embodiment, the display device may further include a power connection line connected to the second power supply line and disposed between adjacent pixel columns.

In an embodiment, the power connection line may be disposed on the third interlayer insulating layer.

In an embodiment, the first interlayer insulating layer may be disposed on the gate electrode.

In an embodiment, the display device may further include a fourth interlayer insulating layer disposed on the second power supply line, where the display element may be disposed on the fourth interlayer insulating layer.

In an embodiment, the display device may further include: a first bridge pattern connected to the source electrode and the drain electrode, where the first bridge pattern is disposed on the second interlayer insulating layer; and a second bridge pattern electrically connecting the first bridge pattern and the display element therethrough, where the second bridge pattern is disposed on the third interlayer insulating layer.

In an embodiment, the display element may include a first electrode disposed on the fourth interlayer insulating layer, an emitting layer disposed on the first electrode, and a second electrode disposed on the emitting layer. In such an embodiment, the first electrode may be connected to the second bridge pattern through a contact hole defined through the fourth interlayer insulating layer.

In an embodiment, each of the pixels may further include a second transistor connected to the gate electrode, where the second transistor may be diode-connected to the first transistor when the second transistor is turned on in response to a scan signal supplied thereto through a corresponding scan line.

In an embodiment, the extension region may overlap with at least a portion of the second transistor.

In an embodiment, each of the pixels further may include a connection line which connects the second transistor and the gate electrode.

In an embodiment, the extension region may overlap with the connection line.

In an embodiment, the display device may further include a storage capacitor including a lower electrode disposed on the gate insulating layer and an upper electrode disposed on the first interlayer insulating layer.

In an embodiment, each of the active pattern, the source electrode and the drain electrode may include a semiconductor material.

In an embodiment, each of the source electrode and the drain electrode may further include impurities doped in the semiconductor material.

In an embodiment, the power line may be applied with a constant power voltage.

BRIEF DESCRIPTION OF THE DRAWINGS

The above and other aspects and features of the disclosure will become more apparent by describing in further detail exemplary embodiments thereof with reference to the accompanying drawings, in which.

DETAILED DESCRIPTION

Figure 1:
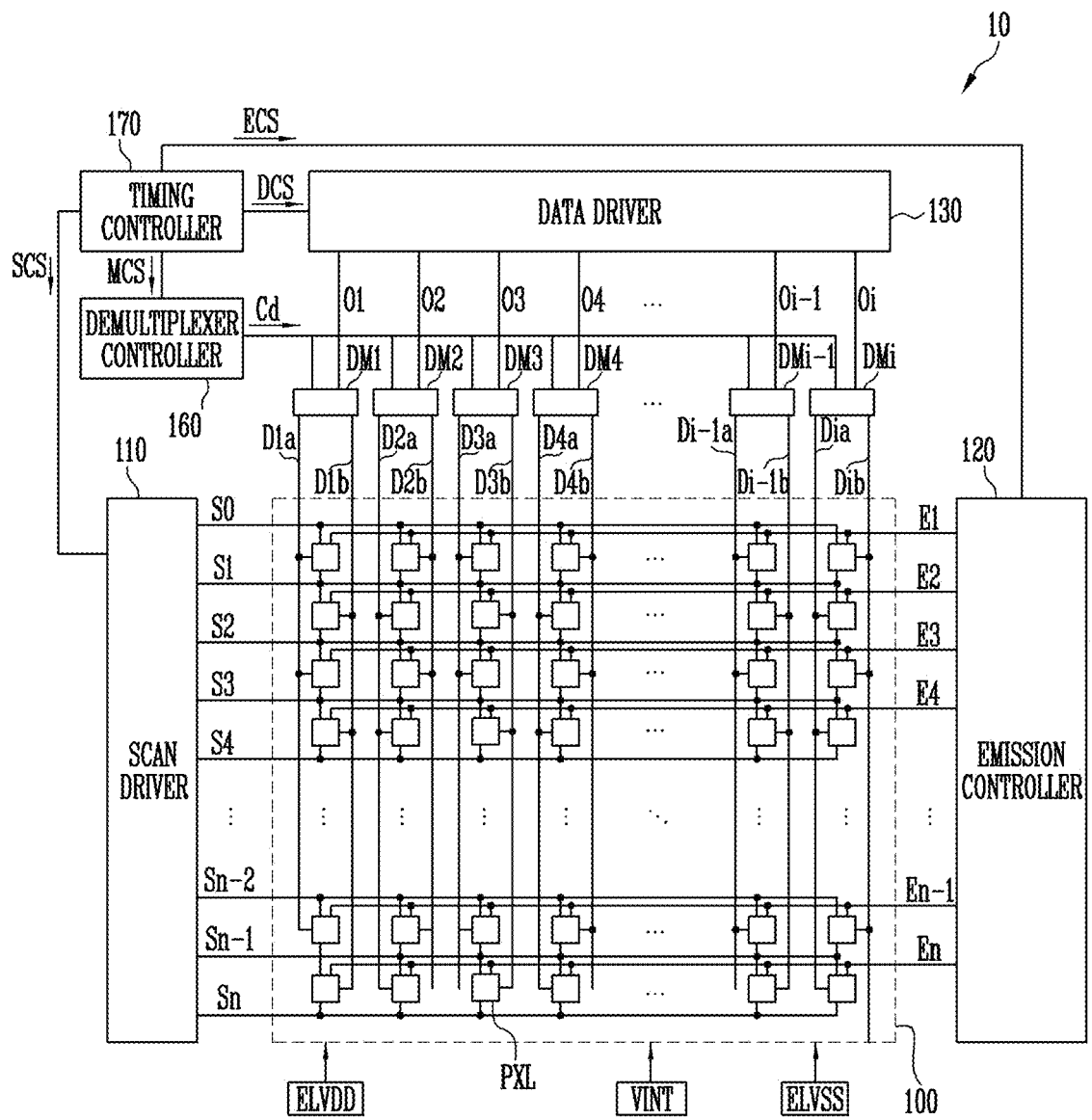
FIG. 1 is a view illustrating a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the disclosure will be described in detail with reference to the accompanying drawings.

FIG. 1 is a view illustrating a display device according to an embodiment of the disclosure.

Referring to FIG. 1, an embodiment of the display device 10 may include pixels PXL, a scan driver 110, an emission controller 120, a data driver 130, demultiplexers DM1 to DMi, a demultiplexer controller 160, and a timing controller 170.

The pixels PXL may be connected to a plurality of scan lines S0 to Sn, a plurality of emission control lines E1 to En, and data lines D1a to Dia and D1b to Dib. In such an embodiment, the pixels PXL may receive scan signals and emission control signals, which are supplied respectively through the scan lines S0 to Sn and the emission control lines E1 to En. In such an embodiment, the pixels PXL may receive data signals supplied through the data lines D1a to Dia and D1b to Dib.

The pixels PXL may be arranged in a matrix form along a plurality of pixel rows extending in one direction and a plurality of pixel columns extending in a direction intersecting the pixel rows. In such an embodiment, the pixel rows may include pixels PXL arranged in a first direction, and the pixel columns may include pixels PXL arranged in a second direction intersecting the first direction. In an embodiment, as described above, the pixels PXL are arranged in a matrix form, but the disclosure is not limited thereto. Alternatively, the pixels PXL may be arranged in one of various forms.

The pixels PXL may be connected to a first power source ELVDD, a second power source ELVSS, and a third power source VINT, to receive power voltages provided from an external power source or power supplier.

Each of the pixels PXL may control the amount of current flowing from the first power source ELVDD to the second power source ELVSS via an organic light emitting diode (not shown), in response to a data signal. In such an embodiment, the organic light emitting diode may generate light with a luminance corresponding to the amount of the current.

The scan driver 110 may supply scan signals to the scan lines S0 to Sn, in response to a scan driver control signal SCS from the timing controller 170. In one embodiment, for example, the scan driver 110 may sequentially supply scan signals to the scan lines S0 to Sn. If the scan signals are sequentially supplied to the scan lines S0 to Sn, pixels PXL may be sequentially selected in units of horizontal lines. In such an embodiment, the scan signal may have a voltage level at which a transistor supplied with the scan signal is turned on.

The emission controller 120 may supply emission control signals to the emission control lines E1 to En, in response to an emission controller control signal ECS from the timing controller 170. In one embodiment, for example, the emission controller 120 may sequentially supply the emission control signals to the emission control lines E1 to En. In such an embodiment, the emission control signal may have a voltage level at which a transistor supplied with the emission control signal is turned on.

The data driver 130 may supply data signals to output lines O1 to Oi, corresponding to a data driver control signal DCS from the timing controller 170. In an embodiment, the data driver 130 may supply the data signals to the demultiplexers DM1 to DMi through the output lines O1 to Oi.

The demultiplexers DM1 to DMi may receive data signals supplied from the data driver 130, and supply the data signals to the data lines D1a to Dia and D1b to Dib. In one embodiment, for example, the demultiplexers DM1 to DMi may receive data signals input through the output lines O1 to Oi, and time-divisionally output the data signals to the data lines D1a to Dia and D1b to Dib, the number of which is greater than that of the output lines O1 to Oi. Therefore, the pixels PXL may receive the data signals supplied through the data lines D1a to Dia and D1b to Dib. In one embodiment, for example, the number of the data lines D1a to Dia and D1b to Di may be set to be two times of that of the output lines O1 to Oi of the data driver 130.

Although not separately shown, a capacitor (not shown) may exist on each of the data lines D1a to Dia and D1b to Dib so as to store signals applied to the data lines D1a to Dia and D1b to Dib. In this case, the capacitors existing on the data lines D1a to Dia and D1b to Dib may be caused by parasitic capacitances. In addition, the capacitors may be physically installed on the data lines D1a to Dia and D1b to Dib.

The demultiplexer controller 160 may control operations of the demultiplexers DM1 to DMi through a driving signal Cd. In one embodiment, for example, the driving signal Cd may controls operations of transistors included in each of the demultiplexers DM1 to DMi. The demultiplexer controller 160 may receive a demultiplexer control signal MCS supplied from the timing controller 170, and generate the driving signal Cd based on the demultiplexer control signal MCS.

In an embodiment, as shown in FIG. 1, the demultiplexer controller 160 is separated from or disposed outside the timing controller 170. Alternatively, the demultiplexer controller 160 may be integrated with the timing controller 170.

The timing controller 170 may control the scan driver 110, the emission controller 120, the data driver 130, and the demultiplexer controller 160. In an embodiment, the timing controller 170 may supply the scan driver control signal SCS and the emission controller control signal ECS respectively to the scan driver 110 and the emission controller 120 to control operations thereof.

In such an embodiment, the timing controller 170 may supply the data driver control signal DCS and the demultiplexer control signal MCS respectively to the data driver 130 and the demultiplexer controller 160 to control operations thereof.

For convenience of description and illustration, the scan driver 110, the emission controller 120, the data driver 130, the demultiplexer controller 160 and the timing controller 170 are individually and separately illustrated in FIG. 1, but not being limited thereto. Alternatively at least some of the components may be integrated with each other.

The first power source ELVDD, the second power source ELVSS and the third power source VINT may provide power voltages to the pixels PXL in a pixel unit 100. In one embodiment, for example, the first power source ELVDD may be a high-potential power source, and the second power source ELVSS may be a low-potential power source. In one embodiment, for example, the first power source ELVDD may be set to a positive voltage, and the second power source ELVSS may be set to a negative voltage or ground voltage. In such an embodiment, the third power source VINT may be set to a voltage lower than that of the data signal.

In an embodiment, as shown in FIG. 1, the pixel rows may be connected to the scan lines S0 to Sn, respectively, and the pixel columns may be connected to the output lines O1 to Oi, respectively.

Figure 2:
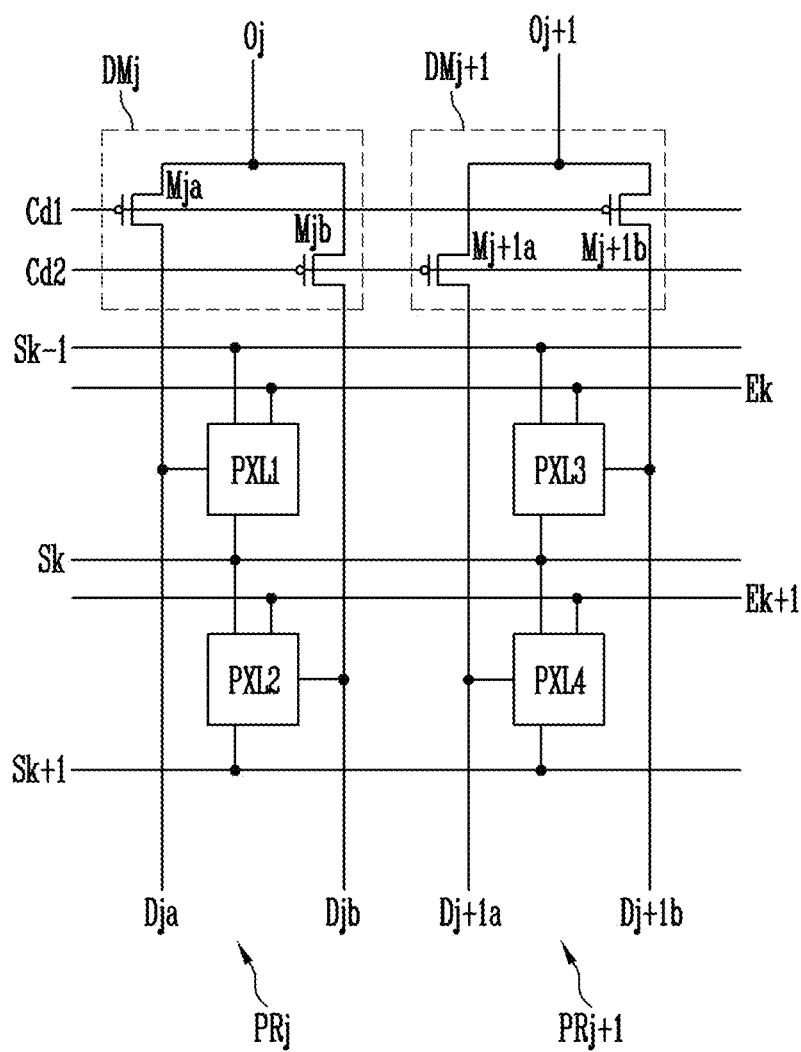
FIG. 2 is a circuit diagram illustrating a demultiplexer according to an embodiment of the disclosure.

FIG. 2 is a circuit diagram illustrating a demultiplexer according to an embodiment of the disclosure. For convenience of description and illustration, only a j-th (j is a natural number) demultiplexer DMj, a (j+1)-th demultiplexer DMj+1, a j-th pixel column PRj, and a (j+1)-th pixel column PRj+1, which are related to a j-th output line Oj and a (j+1)-th output line Oj+1, which transmit data signals output from the data driver of FIG. 1, are illustrated in FIG. 2.

Referring to FIGS. 1 and 2, the j-th demultiplexer DMj may be connected between the j-th output line Oj and j-th data lines Dja and Djb. The j-th data lines Dja and Djb may include a first sub-data line Dja and a second sub-data line Djb.

The j-th demultiplexer DMj may time-divisionally transmit a data signal that is output from the data driver 130 and transmitted through the j-th output line Oj to the first sub-data line Dja and the second sub-data line Djb. In addition, the first sub-data line Dja and the second sub-data line Djb may be connected to pixels PXL constituting a pixel column, i.e., the j-th pixel column PRj.

The first sub-data line Dja may be connected to some pixels of the pixels PXL constituting the j-th pixel column PRj, and the second sub-data line Djb may be connected to the remaining pixels of the pixels PXL constituting the j-th pixel column PRj. In one embodiment, for example, the pixels PXL constituting the j-th pixel column PRj may include first pixels PXL1 and second pixels PXL2, which are alternately disposed. In an embodiment, the first pixels PXL1 may be connected to the first sub-data line Dja, and the second pixels PXL2 may be connected to the second sub-data line Djb.

The first pixels PXL1 and the second pixels PXL2 may emit light of colors different from each other. In one embodiment, for example, the first pixels PXL1 may emit light of red, and the second pixels PXL2 may emit light of blue. In an alternative embodiment, the first pixels PXL1 may emit light of red, and the second pixels PXL2 may emit light of green.

The j-th demultiplexer DMj may include a first transistor Mja and a second transistor Mjb, which are used to transmit the data signal.

The first transistor Mja may be connected between the j-th output line Oj and the first sub-data line Dja, and an on-off operation of the first transistor Mja may be controlled by a first driving signal Cd1. The second transistor Mjb may be connected between the j-th output line Oj and the second sub-data line Djb, and an on-off operation of the second transistor Mjb may be controlled by a second driving signal Cd2.

In one embodiment, for example, when the first driving signal Cd1 is supplied, the first transistor Mja may be turned on, and accordingly, the data signal of the j-th output line Oj is supplied to the first sub-data line Dja. In such an embodiment, when the second driving signal Cd2 is supplied, the second transistor Mjb may be turned on, and accordingly, the data signal of the j-th output line Oj is supplied to the second sub-data line Djb.

The first transistor Mja and the second transistor Mjb may be turned on in periods different from each other. In such an embodiment, the supply period of the first driving signal Cd1 and the supply period of the second driving signal Cd2 may not overlap with each other.

In an embodiment, the (j+1)-th demultiplexer DMj+1 may be connected between the (j+1)-th output line OH and (j+1)-th data lines Dj+1a and Dj+1b.

The (j+1)-th data lines Dj+1a and Dj+1b may include a first sub-data line Dj+1a and a second sub-data line Dj+1b.

The (j+1)-th demultiplexer DMj+1 may time-divisionally transmit a data signal transmitted through the (j+1)-th output line OH to the first sub-data line Dj+1a and the second sub-data line Dj+1b. In an embodiment, the first sub-data line Dj+1a and the second sub-data line Dj+1b may be connected to pixels PXL constituting a pixel column, i.e., the (j+1)-th pixel column PRj+1.

The first sub-data line Dj+1a may be connected to some pixels of the pixels PXL constituting the (j+1)-th pixel column PRj+1, and the second sub-data line Dj+1b may be connected to the remaining pixels of the pixels PXL constituting the (j+1)-th pixel column PRj+1. In one embodiment, for example, the pixels PXL constituting the (j+1)-th pixel column PRj+1 may include third pixels PXL3 and fourth pixels PXL4, which are alternately disposed. In an embodiment, the third pixels PXL3 may be connected to the second sub-data line Dj+1b, and the fourth pixels PXL4 may be connected to the first sub-data line Dj+1a.

The third pixels PXL3 and the fourth pixels PXL4 may emit light of the same color, which is different from those of the first pixels PXL1 and the second pixels PXL2. In one embodiment, for example, where the first pixels PXL1 emit light of red and the second pixels PXL2 emit light of blue, the third pixels PXL3 and the fourth pixels PXL4 may all emit light of green. In an embodiment, where the first pixels PXL1 emit light of red and the second pixels PXL2 emit light of green, the third pixels PXL3 and the fourth pixels PXL4 may all emit light of blue.

The (j+1)-th demultiplexer DMj+1 may include a first transistor Mj+1a and a second transistor Mj+1b, which are used to transmit a data signal.

The first transistor Mj+1a may be connected between the (j+1)-th output line OH and the first sub-data line Dj+1a, and an on-off operation of the first transistor Mj+1a may be controlled by the second driving signal Cd2. The second transistor Mj+1b may be connected between the (j+1)-th output line Oj+1 and the second sub-data line Dj+1b, and an on-off operation of the second transistor Mj+1b may be controlled by the first driving signal Cd1.

In one embodiment, for example, when the first driving signal Cd1 is supplied, the second transistor Mj+1b may be turned on, and accordingly, the data signal of the (j+1)-th output line OH is supplied to the second sub-data line Dj+1b. In such an embodiment, when the second driving signal Cd2 is supplied, the first transistor Mj+1a may be turned on, and accordingly, the data signal of the (j+1)-th output line OH is supplied to the first sub-data line Dj+1a.

The first transistor Mj+1a and the second transistor Mj+1b may be turned on in periods different from each other. In such an embodiment, the supply period of the first driving signal Cd1 and the supply period of the second driving signal Cd2 may not overlap with each other.

In an embodiment, as described above, two sub-data lines Djb and Dj+1a adjacent to each other among the four sub-data lines Dja, Djb, Dj+1a, and Dj+1b connected to the two adjacent pixel columns PRj and PRj+1 may be connected to the second and fourth pixels PXL2 and PXL4 in a same pixel row.

Two sub-data lines Dja and Dj+1b located most distant from each other among the four sub-data lines Dja, Djb, Dj+1a, and Dj+1b connected to the two adjacent pixel columns PRj and PRj+1 may be connected to the first and third pixels PXL1 and PXL3 in a same pixel row.

The two sub-data lines Djb and Dj+1a adjacent to each other among the four sub-data lines Dja, Djb, Dj+1a, and Dj+1b connected to the two adjacent pixel columns PRj and PRj+1 may receive a data signal input during the same period. In an embodiment, the second transistor Mjb of the j-th demultiplexer DMj and the first transistor Mj+1a of the (j+1)-th demultiplexer DMj+1 may maintain an on-state during the same period, and the on-off of the second transistor Mjb of the j-th demultiplexer DMj and the first transistor Mj+1a of the (j+1)-th demultiplexer DMj+1 may be controlled by the second driving signal Cd2.

If data signals are supplied to the two sub-data lines Djb and Dj+1a adjacent to each other at different times, respectively, a change in voltage generated in any one sub-data line may cause a change in voltage of the other sub-data line, and therefore, an undesired coupling noise may occur in the other sub-data line. Thus, in an embodiment of the disclosure, the data signal is applied to the two sub-data lines Djb and Dj+1a adjacent to each other at the same time, so that the coupling noise may be removed or effectively prevented. Accordingly, in such an embodiment, a high-quality image may be realized.

In an embodiment, the two sub-data lines Dja and Dj+1b located most distant from each other among the four sub-data lines Dja, Djb, Dj+1a, and Dj+1b connected to the two adjacent pixel columns PRj and PRj+1 may receive a data signal input during the same period. In such an embodiment, the first transistor Mja of the j-th demultiplexer DMj and the second transistor Mj+1b of the (j+1)-th demultiplexer DMj+1 may maintain the on-state during the same period, and the on-off of the first transistor Mja of the j-th demultiplexer DMj and the second transistor Mj+1b of the (j+1)-th demultiplexer DMj+1 may be controlled by the first driving signal Cd1.

Figure 3:
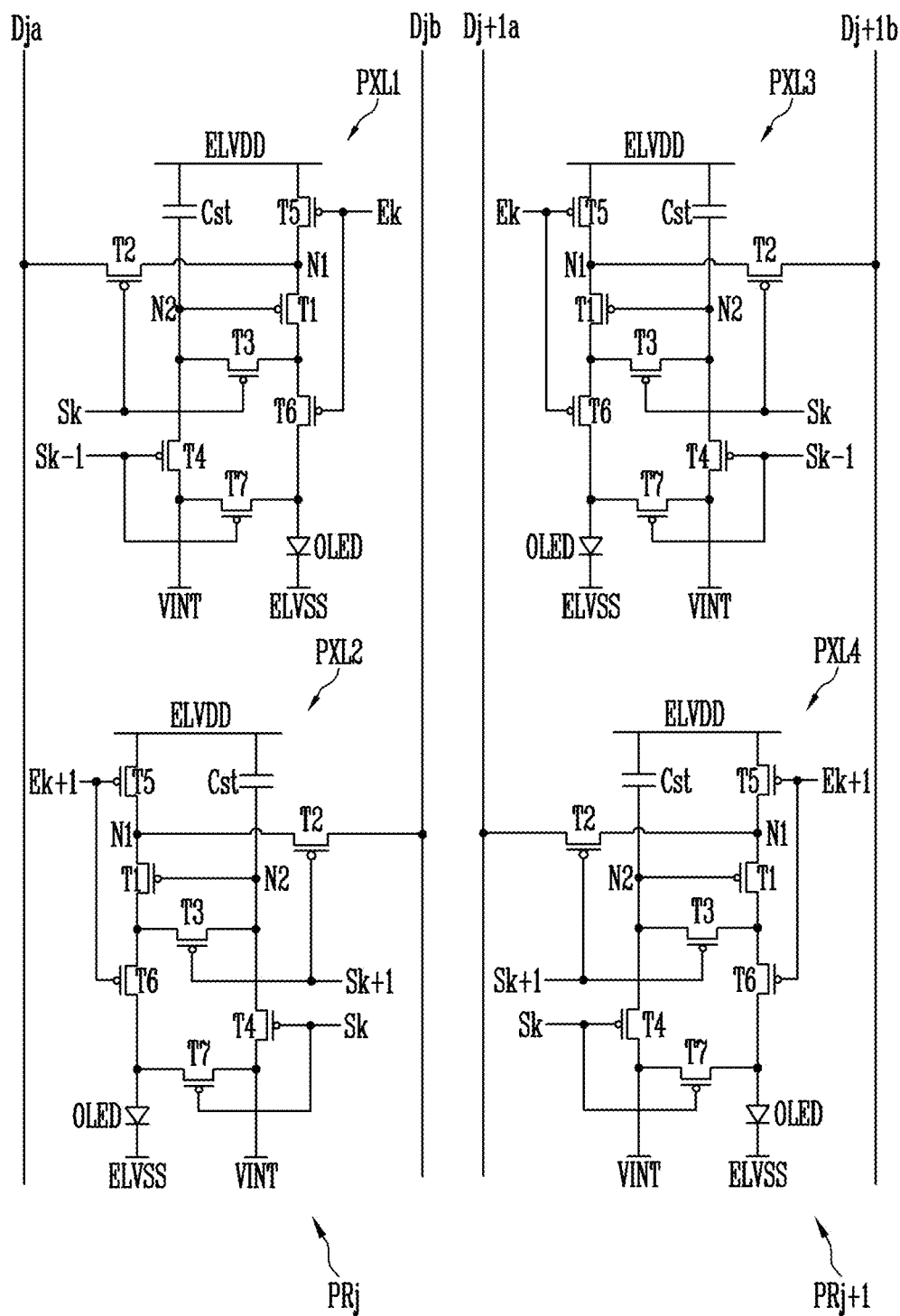
FIG. 3 is a circuit diagram illustrating pixels according to an embodiment of the disclosure.

FIG. 3 is a circuit diagram illustrating pixels according to the embodiment of the disclosure. For convenience of description and illustration, the j-th pixel column PRj and the (j+1)-th pixel column PRj+1, which are located adjacent to each other, are mainly illustrated in FIG. 3.

Referring to FIG. 3, the first pixel PXL1 may include a pixel circuit and an organic light emitting diode OLED.

In the first pixel PXL1, an anode electrode of the organic light emitting diode OLED may be connected to the pixel circuit, and a cathode electrode of the organic light emitting diode OLED may be connected to the second power source ELVSS. The organic light emitting diode OLED may generate light with a predetermined luminance corresponding to the amount of current supplied from the pixel circuit. The first power source ELVDD supplied to the anode electrode to enable current to flow in the organic light emitting diode OLED may be set to a voltage higher than that of the second power source ELVSS.

In the first pixel PXL1, the pixel circuit may control the amount of current flowing from the first power source ELVDD and the second power source ELVSS via the organic light emitting diode OLED, corresponding to a data signal. To this end, the pixel circuit may include a first transistor T1, a second transistor T2, a third transistor T3, a fourth transistor T4, a fifth transistor T5, a sixth transistor T6, a seventh transistor T7, and a storage capacitor Cst.

In the first pixel PXL1, a first electrode of the first transistor (driving transistor) T1 may be connected to a first node N1, and a second electrode of the first transistor T1 may be connected to a first electrode of the sixth transistor T6. In addition, a gate electrode of the first transistor T1 may be connected to a second node N2. The first transistor T1 may control the amount of current supplied from the first power source ELVDD to the second power source ELVSS via the organic light emitting diode OLED, corresponding to a voltage stored in the storage capacitor Cst.

In the first pixel PXL1, the second transistor T2 may be connected between a j-th first sub-data line Dja and the first node N1. In addition, a gate electrode of the second transistor T2 may be connected to a k-th scan line Sk. The second transistor T2 may be turned on when a scan signal is supplied to the k-th scan line Sk to allow the j-th first sub-data line Dja and the first node N1 to be electrically connected to each other.

In the first pixel PXL1, the third transistor T3 may be connected between the second electrode of the first transistor T1 and the second node N2. In addition, a gate electrode of the third transistor T3 may be connected to the k-th scan line Sk. The third transistor T3 may be turned on when the scan signal is supplied to the k-th scan line Sk to allow the first transistor T1 to be diode-connected, thereby compensating for a threshold voltage of the first transistor T1. That is, the third transistor T3 may be a compensation transistor that compensates for the threshold voltage of the first transistor T1.

In the first pixel PXL1, the fourth transistor T4 may be connected between the second node N2 and the third power source VINT. In addition, a gate electrode of the fourth transistor T4 may be connected to a (k−1)-th scan line Sk−1. The fourth transistor T4 may be turned on when the scan signal is supplied to the (k−1)-th scan line Sk−1 to supply a voltage of the third power source VINT to the second node N2.

In the first pixel PXL1, the fifth transistor T5 may be connected between the first power source ELVDD and the first node N1. In addition, a gate electrode of the fifth transistor T5 may be connected to a k-th emission control line Ek. The fifth transistor T5 may be turned off when an emission control signal is supplied to the k-th emission control line Ek, and be turned on when the emission control signal is not supplied.

In the first pixel PXL1, the sixth transistor T6 may be connected between the second electrode of the first transistor T1 and the anode electrode of the organic light emitting diode OLED. In addition, a gate electrode of the sixth transistor T6 may be connected to the k-th emission control line Ek. The sixth transistor T6 may be turned on when the emission control signal is supplied to the k-th emission control line Ek, and be turned on when the emission control signal is not supplied.

In the first pixel PXL1, the seventh transistor T7 may be connected between the anode electrode of the organic light emitting diode OLED and the third power source VINT. In addition, a gate electrode of the seventh transistor T7 may be connected to the (k−1)-th scan line Sk−1. The seventh transistor T7 may be turned on when the scan signal is supplied to the (k−1)-th scan line Sk−1 to supply the voltage of the third power source VINT to the anode electrode of the organic light emitting diode OLED.

In an alternative embodiment, the gate electrode of the seventh transistor T7 of the first pixel PXL1 may be connected to the k-th scan line Sk or a (k+1)-th scan line.

In an embodiment, the voltage of the third power source VINT may be set to a voltage lower than that of the data signal. If the voltage of the third power source VINT is supplied to the anode electrode of the organic light emitting diode OLED of the first pixel PXL1, a parasitic capacitor of the organic light emitting diode OLED of the first pixel PXL1 is discharged. If an organic capacitor is discharged, the black expression ability of the pixel PXL may be improved.

In the first pixel PXL1, the storage capacitor Cst may be connected between the first power source ELVDD and the second node N2. The storage capacitor Cst may store a voltage corresponding to the data signal and the threshold voltage of the first transistor T1.

In the first pixel PXL1, the first electrode of each of the transistors T1, T2, T3, T4, T5, T6, and T7 may be set to any one of a source electrode and a drain electrode, and the second electrode of each of the transistors T1, T2, T3, T4, T5, T6, and T7 may be set to an electrode different from the first electrode. In one embodiment, for example, if the first electrode is set to the source electrode, the second electrode may be set to the drain electrode.

The second pixel PXL2 may be alternately disposed with the first pixel PXL1 in the same pixel column or the j-th pixel column PRj. The second pixel PXL2 may have a circuit configuration similar to that of the first pixel PXL1.

In such an embodiment, the second pixel PXL2 is in a next pixel row, as compared with the first pixel PXL1. Therefore, the second pixel PXL2 may be connected to the k-th scan line Sk, the (k+1)-th scan line Sk+1, and a (k+1)-th emission control line Ek+1.

In the second pixel PXL2, a gate electrode of a second transistor T2 and a gate electrode of a third transistor T3 may be connected to the (k+1)-th scan line Sk+1, a gate electrode of a fourth transistor T4 and a gate electrode of a seventh transistor T7 may be connected to the k-th scan line Sk, and a gate electrode of a fifth transistor T5 and a gate electrode of a sixth transistor T6 may be connected to the (k+1)-th emission control line Ek+1.

In an embodiment, the second pixel PXL2 may be connected to a j-th second sub-data line Djb. In such an embodiment, the second transistor of the second pixel PXL2 may be connected between the j-th second sub-data line Djb and a first node N1.

The third pixel PXL3 may have a circuit configuration similar to that of the first pixel PXL1, and be disposed in a same pixel row line as the first pixel PXL1. Therefore, In an embodiment, the third pixel PXL3 may be connected to the (k−1)-th scan line Sk−1, the k-th scan line Sk, and the k-th emission control line Ek. However, since the third pixel PXL3 is located on a different pixel column PRj+1 from the first pixel PXL1, the third pixel PXL3 may be connected to a (j+1)-th second sub-data line Dj+1b. In an embodiment, a second transistor T2 of the third pixel PXL3 may be connected between the (j+1)-th second sub-data line Dj+1b and a first node N1.

The fourth pixel PXL4 may be alternately disposed with the third pixel PXL3 on the same pixel column, i.e., the (j+1)-th pixel column PRj+1. The fourth pixel PXL4 may have a circuit configuration similar to that of the third pixel PXL3. However, the fourth pixel PXL4 is in the next pixel row, as compared with the third pixel PXL3. Therefore, the fourth pixel PXL4 may be connected to the k-th scan line Sk, the (k+1)-th scan line Sk+1, and the (k+1)-th emission control line Ek+1. In the fourth pixel PXL4, a gate electrode of a second transistor T2 and a gate electrode of the third transistor T3 may be connected to the (k+1)-th scan line Sk+1, a gate electrode of a fourth transistor T4 and a gate electrode of a seventh transistor T7 may be connected to the k-th scan line Sk, and a gate electrode of a fifth transistor T5 and a gate electrode of a sixth transistor T6 may be connected to the (k+1)-th emission control line Ek+1.

The fourth pixel PXL4 may be connected to a (j+1)-th first sub-data line Dj+1a. In an embodiment, the second transistor T2 of the fourth pixel PXL4 may be connected between the (j+1)-th first sub-data line Dj+1a and a first node N1.

In an embodiment, two sub-data lines Djb and Dj+1a adjacent to each other among the four sub-data lines Dja, Djb, Dj+1a, and Dj+1b connected to two pixel columns adjacent to each other, e.g., the j-th pixel column and the (j+1)-th pixel column may be connected to pixels in a same pixel row. In such an embodiment, two sub-data lines Dja and Dj+1b located most distant from each other among the four sub-data lines Dja, Djb, Dj+1a, and Dj+1b connected to the two pixel columns adjacent to each other may be connected to pixels in a same pixel row.

Figure 4:
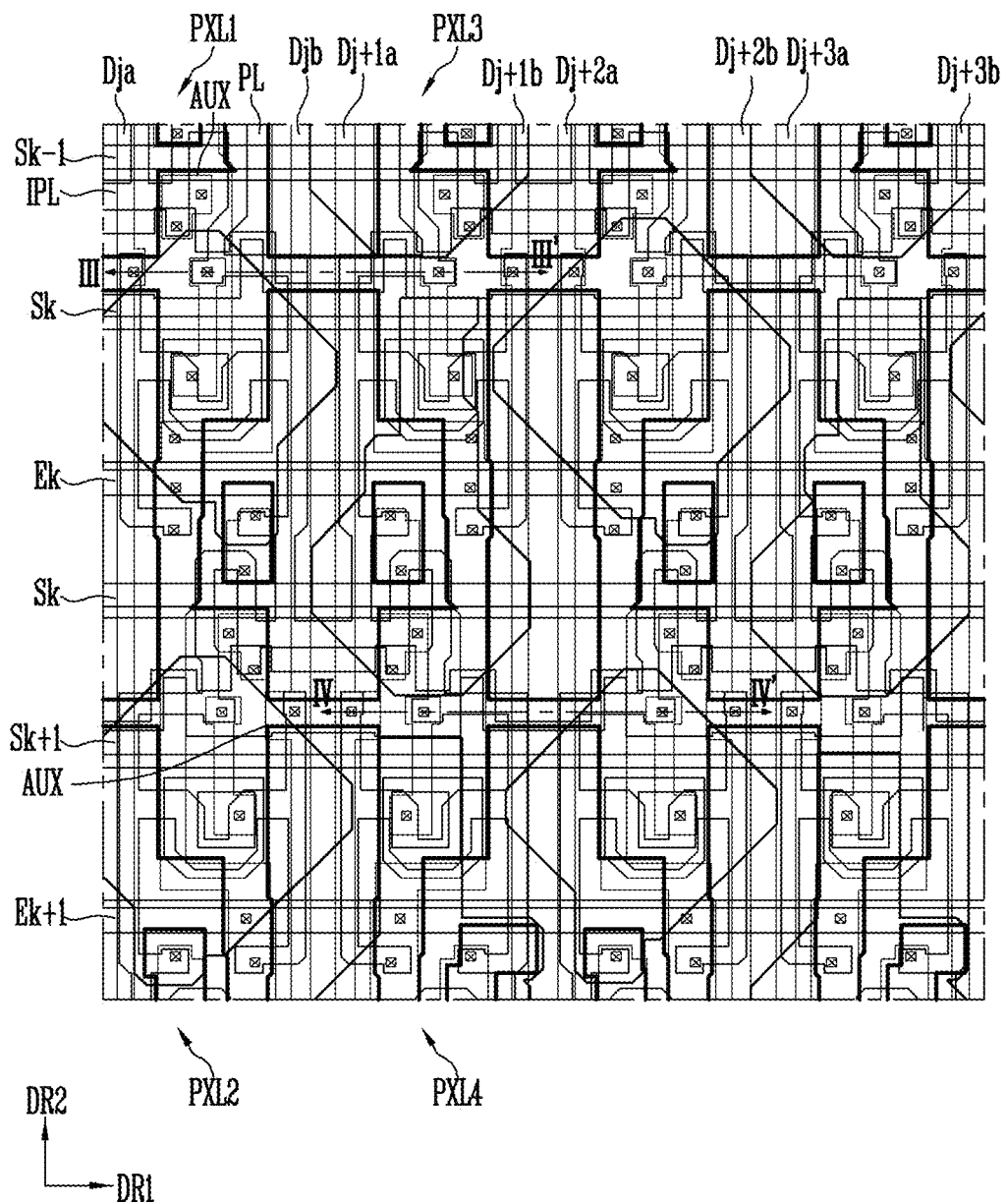
FIG. 4 is a plan view illustrating pixels in a k-th pixel row, a (k+1)-th pixel row, a j-th pixel column, a (j+2)-th pixel column, and a (j+3)-th pixel column in the display device according to an embodiment of the disclosure.
Figure 5:
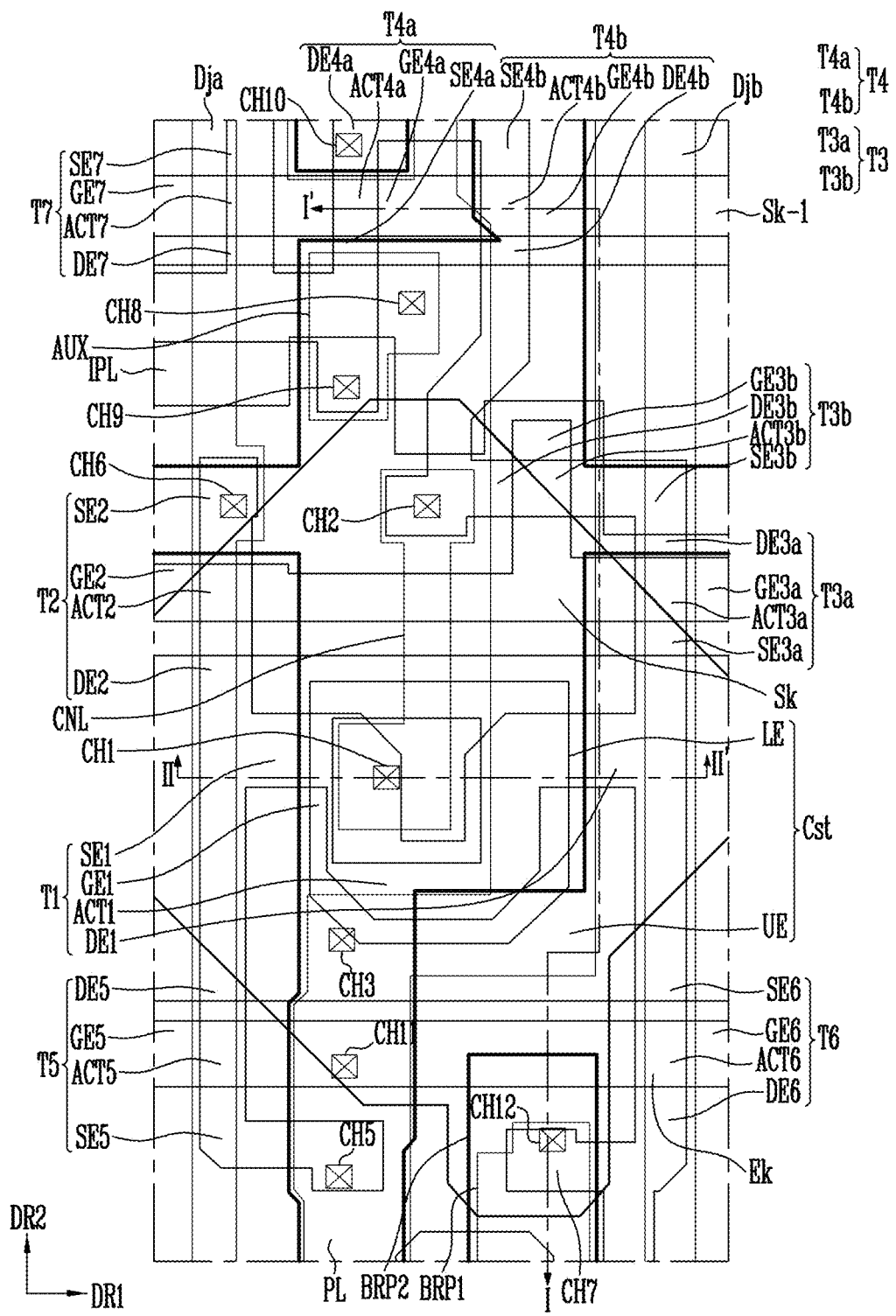
FIG. 5 is a plan view illustrating a pixel disposed in the k-th pixel row and the j-th pixel column, shown in FIG. 4.
Figure 6:
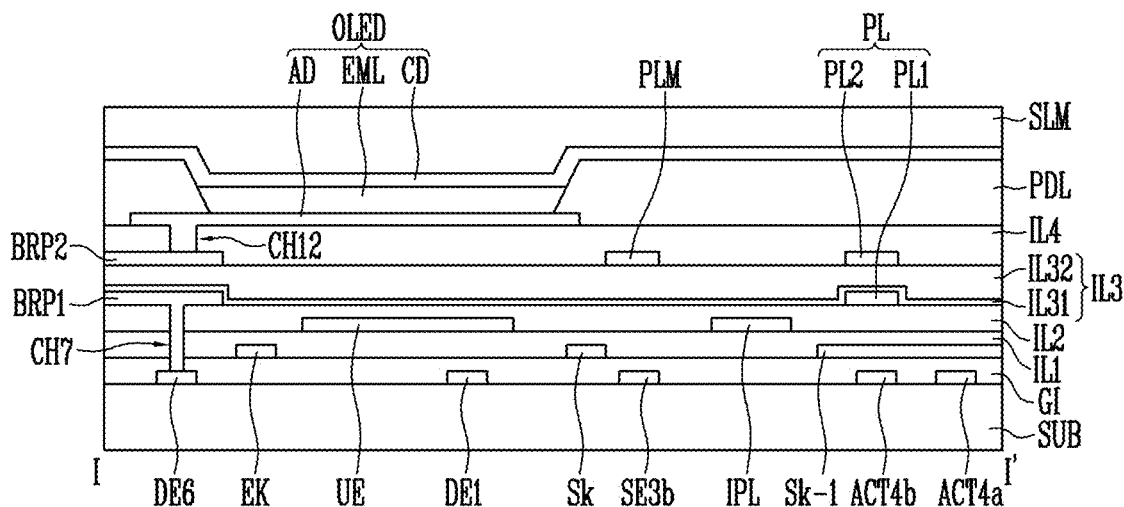
FIG. 6 is a cross-sectional view taken along line I-I' of FIG. 5.
Figure 7:
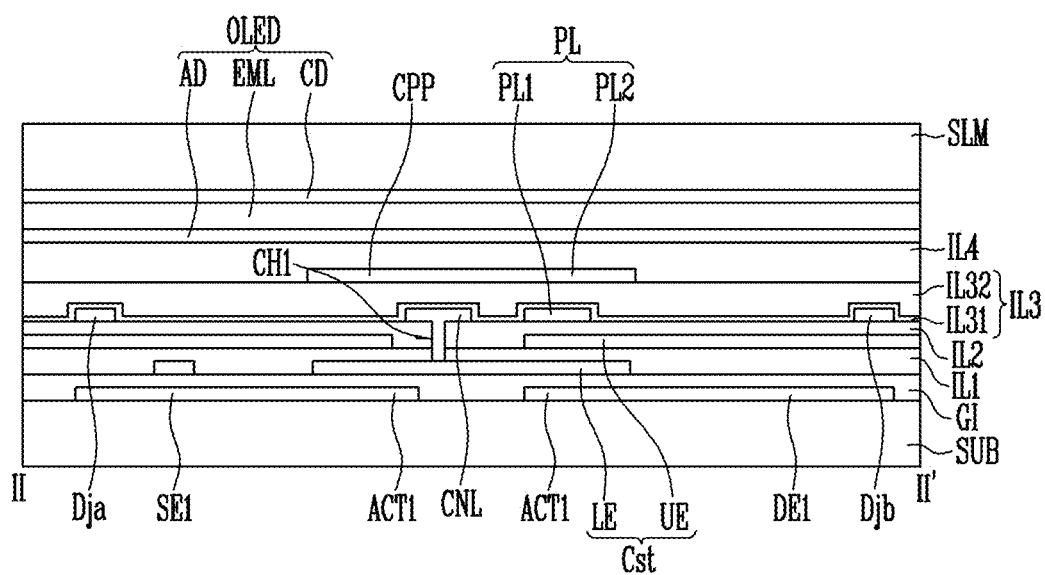
FIG. 7 is a cross-sectional view taken along line II-II' of FIG. 5.
Figure 8:
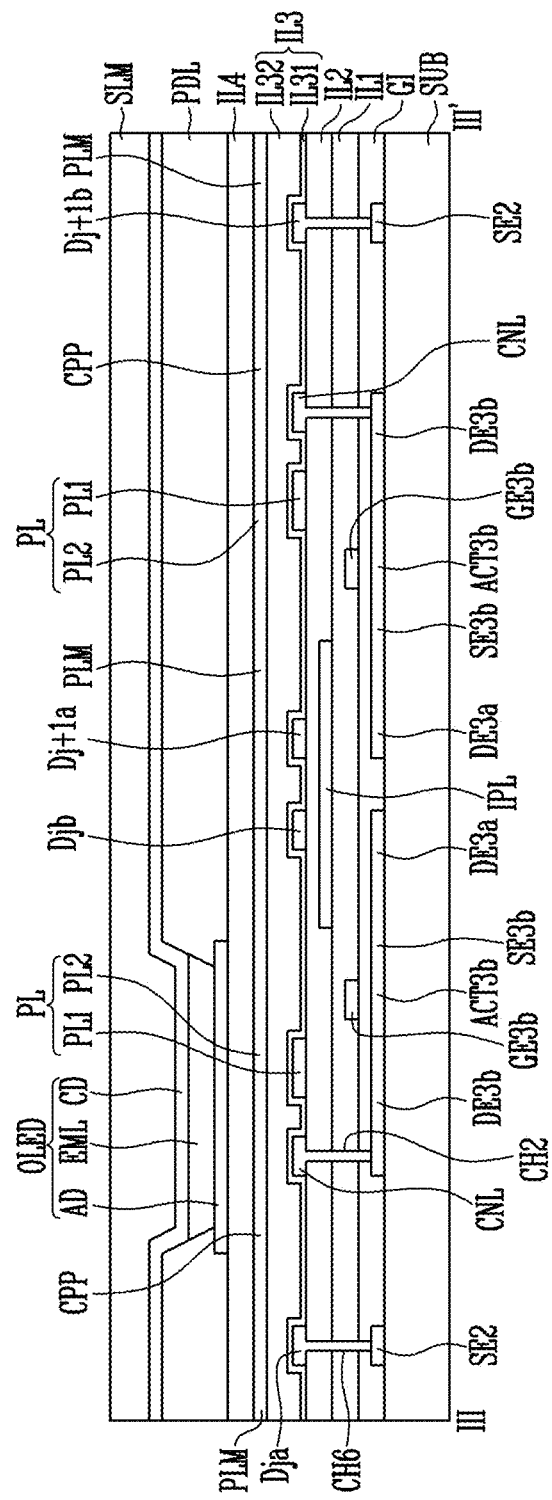
FIG. 8 is a cross-sectional view taken along line III-III' of FIG. 4.
Figure 9:
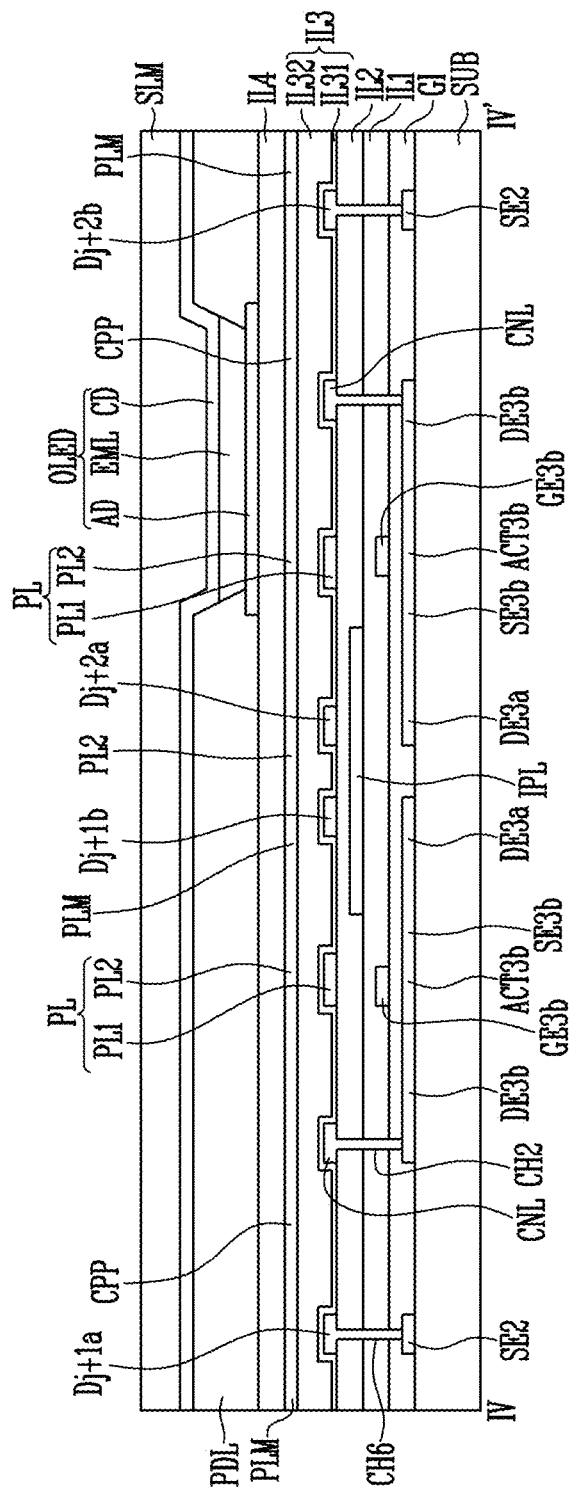
FIG. 9 is a cross-sectional view taken along line IV-IV' of FIG. 4.

FIG. 4 is a plan view illustrating pixels in a k-th pixel row, a (k+1)-th pixel row, a j-th pixel column, a (j+2)-th pixel column, and a (j+3)-th pixel column in the display device according to the embodiment of the disclosure. FIG. 5 is a plan view illustrating a pixel in the k-th pixel row and the j-th pixel column, shown in FIG. 4. FIG. 6 is a cross-sectional view taken along line I-I' of FIG. 5. FIG. 7 is a cross-sectional view taken along line II-II' of FIG. 5. FIG. 8 is a cross-sectional view taken along line III-III' of FIG. 4. FIG. 9 is a cross-sectional view taken along line IV-IV' of FIG. 4.

Referring to FIGS. 1 to 9, an embodiment of the display device may include a substrate SUB and pixels disposed on the substrate SUB.

The substrate SUB may include a transparent insulating material to enable light to be transmitted therethrough. The substrate SUB may be a rigid substrate. In one embodiment, for example, the substrate SUB may be one of a glass substrate, a quartz substrate, a glass ceramic substrate, and a crystalline glass substrate.

In an alternative embodiment, the substrate SUB may be a flexible substrate. In such an embodiment, the substrate SUB may be one of a film substrate including a polymer organic material and a plastic substrate. In one embodiment, for example, the substrate SUB may include at least one selected from polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide ("PI"), polycarbonate, triacetate cellulose, and cellulose acetate propionate. However, the material constituting the substrate SUB may be variously changed. In one alternative embodiment, for example, the substrate SUB may include a fiber reinforced plastic ("FRP").

The pixels PXL may be arranged in a matrix form along a plurality of pixel rows extending in a first direction DR1 and a plurality of pixel columns extending in a second direction DR2 intersecting the pixel rows. In such an embodiment, the pixel rows may include pixels PXL arranged in the first direction DR1 and include pixels PXL arranged in the second direction DR2.

The pixels PXL may include a first pixel PXL1, a second pixel PXL2, a third pixel PXL3 and a fourth pixel PXL4. The first pixel PXL1 may be a pixel disposed in a k-th pixel row and a j-th pixel column, the second pixel PXL2 may be a pixel disposed in a (k+1)-th pixel row and the j-th pixel column, the third pixel PXL3 may be a pixel disposed in the k-th pixel row and a (j+1)-th pixel column, and the fourth pixel PXL4 may be a pixel disposed in the (k+1)-th pixel row and the (j+1)-th pixel column.

The pixels PXL may be connected to scan lines Sk−1, Sk, and Sk+1, data lines Dja, Djb, Dj+1a, Dj+1b, Dj+2a, Dj+2b, Dj+3a, and Dj+3b, emission control lines Ek and Ek1, a power line PL, and an initialization power line IPL.

The scan lines Sk−1, Sk and Sk+1 may extend in the first direction DR1. The scan lines Sk−1, Sk and Sk+1 may include a (k−1)-th scan line Sk−1, a k-th scan line Sk, and a (k+1)-th scan line Sk+1, which are sequentially arranged along the second direction DR2. The scan lines Sk−1, Sk and Sk+1 may receive scan signals to be transmitted therethrough. In one embodiment, for example, the (k−1)-th scan line Sk−1 may receive a (k−1)-th scan signal. The (k−1)-th scan line Sk−1 may initialize pixels PXL in the k-th pixel row by the (k−1)-th scan signal. The k-th scan line Sk may receive a k-th scan signal. The (k+1)-th scan line Sk+1 may receive a (k+1)-th scan signal.

The data lines Dja, Djb, Dj+1a, Dj+1b, Dj+2a, Dj+2b, Dj+3a and Dj+3b may extend in the second direction DR2. The data lines Dja, Djb, Dj+1a, Dj+1b, Dj+2a, Dj+2b, Dj+3a and Dj+3b may include j-th data lines Dja and Djb, (j+1)-th data lines Dj+1a and Dj+1b, (j+2)-th data lines Dj+2a and Dj+2b, and (j+3)-th data lines Dj+3a and Dj+3b, which are sequentially arranged along the first direction DR1.

The j-th data lines Dja and Djb, (j+1)-th data lines Dj+1a and Dj+1b, (j+2)-th data lines Dj+2a and Dj+2b, and (j+3)-th data lines Dj+3a and Dj+3b may include first sub-data lines Dja, Dj+1a, Dj+2a, and Dj+3a and second sub-data lines Djb, Dj+1b, Dj+2b, and Dj+3b, respectively. The first sub-data lines Dja, Dj+1a, Dj+2a, and Dj+3a and the second sub-data lines Djb, Dj+1b, Dj+2b, and Dj+3b may be disposed at both sides of pixel columns, respectively. In one embodiment, for example, the first sub-data lines Dja, Dj+1a, Dj+2a, and Dj+3a may be disposed at one sides of the pixel columns, respectively, and the second sub-data lines Djb, Dj+1b, Dj+2b, and Dj+3b ma be disposed at the other sides of the pixel columns, respectively.

The emission control lines Ek and Ek+1 may extend in the first direction. The k-th emission control line Ek may be disposed between k-th scan lines Sk to be spaced apart from the k-th scan lines Sk. The (k+1)-th emission control lines Ek+1 may be disposed between (k+1)-th scan lines Sk+1 to be spaced apart from the (k+1)-th scan lines Sk+1. The emission control lines Ek and Ek+1 may receive an emission control signal applied thereto.

The power line PL may be spaced apart from the data lines Dja, Djb, Dj+1a, Dj+1b, Dj+2a, Dj+2b, Dj+3a, and Dj+3b. In one embodiment, for example, the power line PL may be disposed between the first sub-data lines Dja, Dj+1a, Dj+2a, and Dj+3a and the second sub-data lines Djb, Dj+1b, Dj+2b, and Dj+3b. The power line PL may receive one of the first power source ELVDD and the second power source ELVSS, e.g., the first power source ELVDD, which is applied thereto. In such an embodiment, the power line PL pixels PXL may cross the pixels PXL between the first sub-data lines Dja, Dj+1a, Dj+2a, and Dj+3a and the second sub-data lines Djb, Dj+1b, Dj+2b.

The initialization power line IPL may extend along the first direction DR1. The initialization power line IPL between pixels PXL on the k-th pixel row and pixels PXL in the (k+1)-th row. The initialization power line IPL may receive the initialization power source VINT applied thereto.

Hereinafter, a first pixel PXL1 disposed in the k-th pixel row and the j-th pixel column will be described in detail.

The first pixel PXL1 may be connected to the (k−1)-th scan line Sk−1, the k-th scan line Sk, the first sub-data line Dja of the j-th data lines Dja and Djb, the k-th emission control line Ek, the power line PL, and the initialization power line IPL.

In such an embodiment, the first pixel PXL1 may include first to seventh transistors T1 to T7, a storage capacitor Cst, and a display element OLED.

The first transistor T1 may include a first gate electrode GE1, the first active pattern ACT1, a first source electrode SE1 and a first drain electrode DE1.

The first gate electrode GE1 may be connected to a third drain electrode DE3 of the third transistor T3 and a fourth drain electrode DE4 of the fourth transistor T4. The first pixel PXL1 may further include a connection line CNL that connects the first gate electrode GE1 with the third and fourth drain electrodes DE3 and DE4. One end of the connection line CNL may be connected to the first gate electrode GE1 through a first contact hole CHL and the other end of the connection line CNL may be connected to the third and fourth drain electrodes DE3 and DE4 through a second contact hole CH2. Therefore, the connection line CNL may connect the first gate electrode GE1 of the first transistor T1 to the third drain electrode DE3 of the third transistor T3.

In an embodiment of the disclosure, the first active pattern ACT1, the first source electrode SE1, and the first drain electrode DE1 may include or be formed of a semiconductor layer undoped or doped with impurities. In one embodiment, for example, the first source electrode SE1 and the first drain electrode DE1 may include or be formed of a semiconductor layer doped with impurities, and the first active pattern ACT1 may include or be formed of a semiconductor layer undoped with impurities.

The first active pattern ACT1 has a bar shape extending in a predetermined direction. In an embodiment, as shown in FIG. 5, the first active pattern ACT1 may have a bent shape in which it is bent along the extending direction. The first active pattern ACT1 may overlap with the first gate electrode GE1 when viewed from a top plan view or a plan view in a thickness direction of the substrate SUB. As the first active pattern ACT1 has a bent shape, which is curved or bent several times, the length of a channel region of the first transistor T1 may be substantially increased. Thus, the driving range of a gate voltage applied to the first transistor T1 may be widened. Accordingly, the gray scale of light to be emitted from the organic light emitting diode OLED may be precisely controlled.

The first source electrode SE1 may be connected to one end of the first active pattern ACT1. The first source electrode SE1 may be connected to a second drain electrode DE2 of the second transistor T2 and a fifth drain electrode DE5 of the fifth transistor T5. The first drain electrode DE1 may be connected to the other end of the first active pattern ACT1. The first drain electrode DE1 may be connected to a third source electrode SE3 of the third transistor T3 and a sixth source electrode SE6 of the sixth transistor T6.

The second transistor T2 may include a second gate electrode GE2, a second active pattern ACT2, a second source electrode SE2, and the second drain electrode DE2.

The second gate electrode GE2 may be connected to the k-th scan line Sk. The second gate electrode GE2 may be defined by a portion of the k-th scan line Sk or be defined by a protruding portion of the k-th scan line Sk. In an embodiment of the disclosure, the second active pattern ACT2, the second source electrode SE2 and the second drain electrode DE2 may include or be formed of a semiconductor undoped or doped with impurities. In one embodiment, for example, the second source electrode SE2 and the second drain electrode DE2 may include or be formed of a semiconductor doped with impurities, and the second active pattern ACT2 may include or be formed of a semiconductor layer undoped with impurities. The second active pattern ACT2 corresponds to a portion overlapping with the second gate electrode GE2. One end of the second source electrode SE2 may be connected to the second active pattern ACT2. The other end of the second source electrode SE2 may be connected to the data line Dja through a sixth contact hole CH6. One end of the second drain electrode DE2 may be connected to the second active pattern ACT2. The other end of the second drain electrode DE2 may be connected to the first source electrode SE1 of the first transistor T1 and the fifth drain electrode DE5 of the fifth transistor T5.

The third transistor T3 may have a double gate structure to prevent a leakage current. In such an embodiment, the third transistor T3 may include a first third transistor T3$a$ and a second third transistor T3$b$. The first third transistor T3$a$ may include a first third gate electrode GE3$a$, a first third active pattern ACT3$a$, a first third source electrode SE3$a$, and a first third drain electrode DE3$a$. The second third transistor T3$b$ may include a second third gate electrode GE3$b$, a second third active pattern ACT3$b$, a second third source electrode SE3$b$, and a second third drain electrode DE3$b$. Hereinafter, the first third gate electrode GE3$a$ and the second third gate electrode GE3$b$ are collectively referred to as a third gate electrode GE3, the first third active pattern ACT3$a$ and the second third active pattern ACT3$b$ are collectively referred to as a third active pattern ACT3, the first third source electrode SE3$a$ and the second third source electrode SE3$b$ are collectively referred to as the third source electrode SE3, and the first third drain electrode DE3$a$ and the second third drain electrode DE3$b$ are collectively referred to as the third drain electrode DE3.

The third gate electrode GE3 may be connected to the k-th scan line Sk. The third gate electrode GE3 may be defined by a portion of the i-th scan line Si or be defined by a protruding portion of the k-th scan line Sk. In one embodiment, for example, the first third gate electrode GE3$a$ may be defined by a portion of the k-th scan line Sk, and the second third gate electrode GE3$b$ may be defined by a protruding portion of the k-th scan line Sk.

The third active pattern ACT3, the third source electrode SE3 and the third drain electrode DE3 may include or be formed of a semiconductor layer undoped or doped with impurities. In one embodiment, for example, the third source electrode SE3 and the third drain electrode DE3 may include or be formed of a semiconductor layer doped with impurities, and the third active pattern ACT3 may include or be formed of a semiconductor layer undoped with impurities. The third active pattern ACT3 corresponds to a portion overlapping with the third gate electrode GE3. One end of the third source electrode SE3 may be connected to the third active pattern ACT3. The other end of the third source electrode SE3 may be connected to the first drain electrode DE1 of the first transistor T1 and the sixth source electrode SE6 of the sixth transistor T6. One end of the third drain electrode DE3 may be connected to the third active pattern ACT3. The other end of the third drain electrode DE3 may be connected to the fourth drain electrode DE4 of the fourth transistor T4. In such an embodiment, the third drain electrode DE3 may be connected to the first gate electrode GE1 of the first transistor T1 through the connection line CNL, the second contact hole CH2 and the first contact hole CH1.

The fourth transistor T4 may have a double gate structure to prevent a leakage current. In such an embodiment, the fourth transistor T4 may include a first fourth transistor T4$a$ and a second fourth transistor T4$b$. The first fourth transistor T4$a$ may include a first fourth gate electrode GE4$a$, a first fourth active pattern ACT4$a$, a first fourth source electrode SE4$a$, and a first fourth drain electrode DE4$a$, and the second fourth transistor T4$b$ may include a second fourth gate electrode GE4$b$, a second fourth active pattern ACT4$b$, a second fourth source electrode SE4$b$, and a second fourth drain electrode DE4$b$. Hereinafter, the first fourth gate electrode GE4$a$ and the second fourth gate electrode GE4$b$ are collectively referred to as a fourth gate electrode GE4, the first fourth active pattern ACT4$a$ and the second fourth active pattern ACT4$b$ are collectively referred to as a fourth active pattern ACT4, the first fourth source electrode SE4$a$ and the second fourth source electrode SE4$b$ are collectively referred to as a fourth source electrode SE4, and the first fourth drain electrode DE4$a$ and the second fourth drain electrode DE4$b$ are collectively referred to as the fourth drain electrode DE4.

The fourth gate electrode GE4 may be connected to the (k−1)-th scan line Sk−1. The fourth gate electrode GE4 may be defined by a portion of the (k−1)-th scan line Sk−1 or may be defined by a protruding portion of the (k−1)-th scan line Sk−1. In one embodiment, for example, the first fourth gate electrode GE4$a$ and the second fourth gate electrode GE4$b$ may be provided as a portion of the (k−1)-th scan line Sk−1.

The fourth active pattern ACT4, the fourth source electrode SE4, and the fourth drain electrode DE4 may include or be formed of a semiconductor layer undoped or doped with impurities. In one embodiment, for example, the fourth source electrode SE4 and the fourth drain electrode DE4 may include or be formed of a semiconductor layer doped with impurities, and the fourth active pattern ACT4 may include or be formed of a semiconductor layer undoped with impurities. The fourth active pattern ACT4 corresponds to a portion overlapping with the fourth gate electrode GE4.

One end of the fourth source electrode SE4 may be connected to the fourth active pattern ACT4. The other end of the fourth source electrode SE4 may be connected to the initialization power line IPL and a seventh drain electrode DE7 of the seventh transistor T7. An auxiliary connection line AUX may be disposed between the fourth source electrode SE4 and the initialization power line IPL. One end of the auxiliary connection line AUX may be connected to the fourth source electrode SE4 through a ninth contact hole CH9. The other end of the auxiliary connection line AUX may be connected to the initialization power line IPL through an eighth contact hole CH8. One end of the fourth drain electrode DE4 may be connected to the fourth active pattern ACT4. The other end of the fourth drain electrode DE4 may be connected to the third drain electrode DE3 of the third transistor T3. In such an embodiment, the fourth drain electrode DE4 may be connected to the first gate electrode GE1 of the first transistor T1 through the connection line CNL, the second contact hole CH2, and the first contact hole CH1.

The fifth transistor T5 may include a fifth gate electrode GE5, a fifth active pattern ACT5, a fifth source electrode SE5 and the fifth drain electrode DE5.

The fifth gate electrode GE5 may be connected to the k-th emission control line Ek. The fifth gate electrode GE5 may be defined by a portion of the k-th emission control line Ek or be defined by a protruding portion of the k-th emission control line Ek. The fifth active pattern ACT, the fifth source electrode SE5, and the fifth drain electrode DE5 may include or be formed of a semiconductor layer undoped or doped with impurities. In one embodiment, for example, the fifth source electrode SE5 and the fifth drain electrode DE5 may include or be formed of a semiconductor layer doped with impurities, and the fifth active pattern ACT5 may include or be formed of a semiconductor layer undoped with impurities. The fifth active pattern ACT5 corresponds to a portion overlapping with the fifth gate electrode GE5. One end of the fifth source electrode SE5 may be connected to the fifth active pattern ACT5. The other end of the fifth source electrode SE5 may be connected to the power line PL through a fifth contact hole CH5. One end of the fifth drain electrode DE5 may be connected to the fifth active pattern ACT5. The other end of the fifth drain electrode DE5 may be connected to the first source electrode SE1 of the first transistor T1 and the second drain electrode DE2 of the second transistor T2.

The sixth transistor T6 may include a sixth gate electrode GE6, a sixth active pattern ACT6, the sixth source electrode SE6, and a sixth drain electrode DE6.

The sixth gate electrode GE6 may be connected to the k-th emission control line Ek. The sixth gate electrode GE6 may be defined by a portion of the k-th emission control line Ek or be defined by a protruding portion of the k-th emission control line Ek. The sixth active pattern ACT6, the sixth source electrode SE6 and the sixth drain electrode DE6 may include or be formed of a semiconductor layer undoped or doped with impurities. In one embodiment, for example, the sixth source electrode SE6 and the sixth drain electrode DE6 may include or be formed of a semiconductor layer doped with impurities, and the sixth active pattern ACT6 may include or be formed of a semiconductor layer undoped with impurities. The sixth active pattern ACT6 corresponds to a portion overlapping with the sixth gate electrode GE6. One end of the sixth source electrode SE6 may be connected to the sixth active pattern ACT6. The other end of the sixth source electrode SE6 may be connected to the first drain electrode DE1 of the first transistor T1 and the third source electrode SE3 of the third transistor T3. One end of the sixth drain electrode DE6 may be connected to the sixth active pattern ACT6. The other end of the sixth drain electrode DE6 may be connected to a seventh source electrode SE7 of the seventh transistor T7.

The seventh transistor T7 may include a seventh gate electrode GE7, a seventh active pattern ACT7, the seventh source electrode SE7 and a seventh drain electrode DE7.

The seventh gate electrode GE7 may be connected to the (k−1)-th scan line Sk−1. The seventh gate electrode GE7 may be defined by a portion of the (k−1)-th scan line Sk−1 or be defined by a protruding portion of the (k−1)-th scan line Sk−1. The seventh active pattern ACT7, the seventh source electrode SE7 and the seventh drain electrode DE7 may include or be formed of a semiconductor layer undoped or doped with impurities. In one embodiment, for example, the seventh source electrode SE7 and the seventh drain electrode DE7 may include or be formed of a semiconductor layer doped with impurities, and the seventh active layer ACT7 may include or be formed of a semiconductor layer undoped with impurities. The seventh active pattern ACT7 corresponds to a portion overlapping with the seventh gate electrode GE7. One end of the seventh source electrode SE7 may be connected to the seventh active pattern ACT7. The other end of the seventh source electrode SE7 may be connected to a sixth drain electrode DE6 of a sixth transistor T6 of a pixel on a (k−1)-th pixel row. One end of the seventh drain electrode DE7 may be connected to the seventh active pattern ACT7. The other end of the seventh drain electrode DE7 may be connected to the initialization power line IPL. Also, the seventh drain electrode DE7 may be connected to the fourth source electrode SE4 of the fourth transistor T4. The seventh drain electrode DE7 may be connected to the fourth source electrode SE4 of the fourth transistor T4 through the auxiliary connection line AUX, the eighth contact hole CH8, and the ninth contact hole CH9.

The storage capacitor Cst may include a lower electrode LE and an upper electrode UE. The lower electrode LE may be defined by the first gate electrode GE1 of the first transistor T1.

The upper electrode UE overlaps with the first gate electrode GE1, and may cover the lower electrode LE when viewed from a top plan view. As the overlapping area of the upper electrode UE and the lower electrode LE is widened, the capacitance of the storage capacitor Cst may be increased. The upper electrode UE may extend in the first direction DR1. In an embodiment of the disclosure, a voltage having the same level as the first power source ELVDD may be applied to the upper electrode UE. An opening is define din the upper electrode UE at a portion of a region including the first contact hole CH1 through which the first gate electrode GE1 and the connection line CNL are in contact with each other.

The display element OLED may include a first electrode AD, a second electrode CD, and an emitting layer EML disposed between the first electrode AD and the second electrode CD.

The first electrode AD may be disposed in a region corresponding to a light emitting region of the first pixel PXL1. The light emitting region of the first pixel PXL1 may overlap with the first electrode AD. The first electrode AD may be connected to the sixth drain electrode DE6 of the sixth transistor T6 through a seventh contact hole CH7, a tenth contact hole CH10 and a twelfth contact hole CH12. A first bridge pattern BRP1 may be disposed between the seventh contact hole CH7 and the tenth contact hole CH10. A second bridge pattern BRP2 may be disposed between the tenth contact hole CH10 and the twelfth contact hole CH12. The first bridge pattern BRP1 and the second bridge pattern BRP2 may connect the first electrode AD to the sixth drain electrode DE6.

Each of the second pixel PXL2 in the (k+1)-th pixel row and the j-th pixel column, the third pixel PXL3 in the k-th pixel row and the (j+1)-th pixel column, and the fourth pixel PXL4 in the (k+1)-th pixel row and the (j+1)-th pixel column may have a structure similar to that of the first pixel PXL1, except data lines, scan lines and emission control lines, which are connected thereto.

The second pixel PXL2 may be connected to the k-th scan line Sk, the (k+1)-th scan line Sk+1, the second sub-data line Djb out of the j-th data lines Dja and Djb, the (k+1)-th emission control line Ek+1, the power line PL and the initialization power line IPL.

The third pixel PXL3 may be connected to the (k−1)-th scan line Sk−1, the k-th scan line Sk, the second sub-data line Dj+1b out of the (j+1)-th data lines Dj+1a and Dj+1b, the k-th emission control line Ek, the power line PL and the initialization power line IPL.

The fourth pixel PXL4 may be connected to the k-th scan line Sk, the (k+1)-th scan line Sk+1, the first sub-data line Dj+1a out of the (j+1)-th data lines Dj+1a and Dj+1b, the (k+1)-th emission control line Ek+1, the power line PL and the initialization power line IPL.

Hereinafter, a structure of an embodiment of the first pixel PXL1 will be described in greater detail in terms of a stacking order with reference to FIGS. 4 to 9.

A semiconductor pattern may be disposed on the substrate SUB. The semiconductor pattern may include the first to seventh active patterns ACT1 to ACT7, the first to seventh source electrodes SE1 to SE7, and the first to seventh drain electrodes DE1 to DE7. The semiconductor pattern may include a semiconductor material.

A buffer layer (not shown) may be disposed between the substrate SUB and the semiconductor pattern.

The buffer layer may effectively prevent impurities from being diffused into the first to seventh active patterns ACT1 to ACT7 from the substrate SUB. The buffer layer may have a single-layer structure, or a multi-layer structure including at least two layers. The buffer layer may include at least one of an organic insulating layer and an inorganic insulating layer. The organic insulating layer may include an organic insulating material to enable light to be transmitted therethrough. The inorganic insulating layer may include at least one of silicon oxide, silicon nitride, and silicon oxynitride. In an embodiment, where the buffer layer includes multiple layers, the layers may include the same material or include different materials. In one embodiment, for example, the inorganic insulating layer may include a first layer including silicon oxide and a second layer including silicon nitride.

A gate insulating layer GI may be disposed on the substrate SUB to cover the semiconductor pattern.

The gate insulating layer GI may include at least one of an organic insulating layer and an inorganic insulating layer. The organic insulating layer may include an organic insulating material to enable light to be transmitted therethrough. In one embodiment, for example, the organic insulating layer may include at least one of photoresist, polyacrylate resin, epoxy resin, phenolic resin, polyamide ("PA") resin, PI resin, unsaturated polyester resin, polyphenylene ether resin, polyphenylene sulfide resin, and benzocyclobutene ("BCB") resin. The inorganic insulating layer may include at least one of silicon oxide, silicon nitride, and silicon oxynitride.

The (k−1)-th scan line Sk−1, the k-th scan line Sk, the k-th emission control line Ek, and the first to seventh gate electrodes GE1 to GE7 may be disposed on the gate insulating layer GI. A portion of the first gate electrode GE1 may define the lower electrode LE of the storage capacitor Cst. The second gate electrode GE2 and the third gate electrode GE3 may be integrally formed as a single unitary unit with the k-th scan line Sk. The fourth gate electrode GE4 and the seventh gate electrodes GE7 may be integrally formed as a single unitary unit with the (k−1)-th scan line Sk−1. The fifth gate electrode GE5 and the sixth gate electrode GE6 may be integrally formed as a single unitary unit with the k-th emission control line Ek.

The (k−1)-th scan line Sk−1, the k-th scan line Sk, the k-th emission control line Ek, and the first to seventh gate electrodes GE1 to GE7 may include a metallic material. In one embodiment, for example, the (k−1)-th scan line Sk−1, the k-th scan line Sk, the k-th emission control line Ek, and the first to seventh gate electrodes GE1 to GE7 may include at least one of gold (Au), silver (Ag), aluminum (Al), molybdenum (Mo), chromium (Cr), titanium (Ti), nickel (Ni), neodymium (Nd), copper (Co), and an alloy thereof. The (k−1)-th scan line Sk−1, the k-th scan line Sk, the k-th emission control line Ek, and the first to seventh gate electrodes GE1 to GE7 may have a single-layer structure, but the disclosure is not limited thereto. In one alternative embodiment, for example, the (k−1)-th scan line Sk−1, the k-th scan line Sk, the k-th emission control line Ek, and the first to seventh gate electrodes GE1 to GE7 may have a multi-layer structure in which two or more layers including at least one of gold (Au), silver (Ag), aluminum (Al), molybdenum (Mo), chromium (Cr), titanium (Ti), nickel (Ni), neodymium (Nd), copper (Co), and an alloy thereof are stacked one on another.

A first interlayer insulating layer IL1 may be disposed on the substrate SUB to cover the (k−1)-th scan line Sk−1 and the. The first interlayer insulating layer IL1 may include at least one of polysiloxane, silicon oxide, silicon nitride, and silicon oxynitride.

The upper electrode UE of the storage capacitor Cst and the initialization power line IPL may be disposed on the first interlayer insulating layer ILL The upper electrode UE may overlaps with the lower electrode LE when viewed from a top plan view. Overlapping portions of the upper electrode UE and the lower electrode LE may constitute the storage capacitor Cst with the first interlayer insulating layer IL1 interposed therebetween. The upper electrode UE and the initialization power line IPL may have a single-layer or multi-layer structure including at least one of gold (Au), silver (Ag), aluminum (Al), molybdenum (Mo), chromium (Cr), titanium (Ti), nickel (Ni), neodymium (Nd), copper (Co), and any alloy thereof.

A second interlayer insulating layer IL2 may be disposed on the substrate SUB to cover the upper electrode UE and the initialization power line IPL.

The second interlayer insulating layer IL2 may include at least one of an inorganic insulating layer and an organic insulating layer. In one embodiment, for example, the second interlayer insulating layer IL2 may include at least one inorganic insulating layer. The inorganic insulating layer may include at least one of silicon oxide, silicon nitride, and silicon oxynitride. In an embodiment, the second interlayer insulating layer IL2 may include at least one organic insulating layer. The organic insulating layer may include at least one of photoresist, polyacrylate resin, epoxy resin, phenolic resin, PA resin, PI resin, unsaturated polyester resin, polyphenylene ether resin, polyphenylene sulfide resin, and BCB resin. In an embodiment, the second interlayer insulating layer IL2 may have a multi-layer structure including at least one inorganic insulating layer and at least one organic insulating layer.

First conductive patterns may be disposed on the second interlayer insulating layer IL2. The first conductive patterns may include the j-th data lines Dja and Djb, the (j+1)-th data lines Dj+1a and Dj+1b, the (j+2)-th data lines Dj+2a and Dj+2b, the (j+3)-th data lines Dj+3a and Dj+3b, the connection line CNL, the auxiliary connection line AUX, the first bridge pattern BRP1, and a first power supply line PL1 of the power line PL.

The j-th data lines Dja and Djb, the (j+1)-th data lines Dj+1a and Dj+1b, the (j+2)-th data lines Dj+2a and Dj+2b, and the (j+3)-th data lines Dj+3a and Dj+3b may be connected to the second source electrode SE2 through the sixth contact hole CH6 defined through the gate insulating layer GI, the first interlayer insulating layer IL1 and the second interlayer insulating layer IL2.

In an embodiment, all of the j-th data lines Dja and Djb, the (j+1)-th data lines Dj+1a and Dj+1b, the (j+2)-th data lines Dj+2a and Dj+2b, and the (j+3)-th data lines Dj+3a and Dj+3b may be disposed on the second interlayer insulating layer IL2, but the disclosure is not limited thereto. Alternatively, some of the data lines Dja, Djb, Dj+1a, Dj+1b, Dj+2a, Dj+2b, Dj+3a, and Dj+3b may be disposed on the second interlayer insulating layer IL2, and the others of the data lines Dja, Djb, Dj+1a, Dj+1b, Dj+2a, Dj+2b, Dj+3a, and Dj+3b may be disposed on a third interlayer insulating layer IL3 which will be described later.

In one embodiment, for example, the first sub-data lines Dja, Dj+1a, Dj+2a, and Dj+3a and the second sub-data lines Djb, Dj+1b, Dj+2b, and Dj+3b may be disposed in different layers, respectively. In an embodiment, first sub-data lines Dj a, Dj+1a, Dj+2a, and Dj+3a and second sub-data lines Djb, Dj+1b, Dj+2b, and Dj+3b, which are adjacent to each other between two pixel columns adjacent to each other, may be disposed in a same layer, which will be described later in greater detail. The first sub-data lines Dj+1a and Dj+3a and the second sub-data lines Djb and Dj+2b, which are provided between the j-th pixel column and the (j+1)-th pixel column and between the (j+2)-th pixel column and the (j+3)-th pixel column, may be disposed on the third interlayer insulating layer IL3. The first sub-data lines Dja and Dj+2a and the second sub-data line Dj+1b and Dj+3b, which are disposed at one side of the j-th pixel column in the opposite direction of the (j+1)-th pixel column, between the (j+1)-th pixel column and the (j+2)-th pixel column, and at one side of the (j+3)-th pixel column in the opposite direction of the (j+2)-th pixel column, may be disposed on the second interlayer insulating layer IL2.

In such an embodiment, the first sub-data lines Dja, Dj+1a, Dj+2a and Dj+3a may be disposed on the second interlayer insulating layer IL2, and the second sub-data lines Djb, Dj+1b, Dj+2b and Dj+3b may be provided on the third interlayer insulating layer IL3.

One end of the connection line CNL may be connected to the first gate electrode GE1 through the first contact hole CH1 defined through the first interlayer insulating layer IL1 and the second interlayer insulating layer IL2. In such an embodiment, the other end of the connection line CNL may be connected to the third drain electrode DE3 and the fourth drain electrode DE4 through the second contact hole CH2 defined through the gate insulating layer GI, the first interlayer insulating layer IL1 and the second interlayer insulating layer IL2.

The auxiliary connection line AUX may be connected to the initialization power line IPL through the eighth contact hole CH8 defined through the second interlayer insulating layer IL2. In such an embodiment, the auxiliary connection line AUX may be connected to the fourth source electrode SE4 and the seventh drain electrode DE7 through the ninth contact hole CH9 defined through the gate insulating layer GI, the first interlayer insulating layer ILL and the second interlayer insulating layer IL2.

The first bridge pattern BRP1 may be a pattern defined by a medium connecting the sixth drain electrode DE6 to the first electrode AD between the sixth drain electrode DE6 and the first electrode AD. The first bridge pattern BRP1 may be connected to the sixth drain electrode DE6 and the first source electrode SE1 through the seventh contact hole CH7 defined through the gate insulating layer GI, the first interlayer insulating layer IL1 and the second interlayer insulating layer IL2.

The first power supply line PL1 may extend substantially in one direction, and a portion of the first power supply line PL1 may have a bent shape. The first power supply line PL1 may be connected to the fifth source electrode SE5 through the fifth contact hole CH5 defined through the gate insulating layer GI, the first interlayer insulating layer IL1, and the second interlayer insulating layer IL2. In such an embodiment, the first power supply line PL1 may be connected to the upper electrode UE through a third contact hole CH3 defined through the second interlayer insulating layer IL2.

The third interlayer insulating layer IL3 may be disposed on the substrate SUB to cover the first conductive patterns. The third interlayer insulating layer IL3 may include a first insulating layer IL31 disposed on the substrate SUB to cover the first conductive patterns, and a second insulating layer IL32 disposed on the first insulating layer IL31. In one embodiment, for example, the first insulating layer IL31 may include at least one of polysiloxane, silicon oxide, silicon nitride, and silicon oxynitride. The second insulating layer IL32 may include an organic insulating material. In one embodiment, for example, the second insulating layer IL32 may include at least one of photoresist, polyacrylate resin, epoxy resin, phenolic resin, PA resin, PI resin, unsaturated polyester resin, polyphenylene ether resin, polyphenylene sulfide resin, and BCB resin.

Second conductive patterns may be disposed on the third interlayer insulating layer IL3. The second conductive patterns may include a second power supply line PL2 of the power line PL, an extension region CPP, and the second bridge pattern BRP2. The second bridge pattern BRP2 may be connected to the first bridge pattern BRP1 through the tenth contact hole CH10 defined through the first insulating layer IL31 and the second insulating layer IL32.

At least a portion of the second power supply line PL2 may overlap with the first power supply line PL1. The second power supply line PL2 may be connected to the first power supply line PL1 through an eleventh contact hole CH11 defined through the first insulating layer IL31 and the second insulating layer IL32. Therefore, the power line PL may include the first power supply line PL1 and the second power supply line PL2.

The extension region CPP may have a shape extending from a portion of the second power supply line PL2 or be defined by an extending portion from the second power supply line PL2. The extension region CPP may overlap with at least a portion of the first transistor T1 of each pixel PXL. In one embodiment, for example, the extension region CPP may overlap with the first gate electrode GE1 of the first transistor T1. In an embodiment, the extension region CPP may overlap with the connection line CNL.

Since the extension region CPP has a shape extending from or is defined by an extending portion from the second power supply line PL2, the extension region CPP may be applied with the same power as the second power supply line PL2. Accordingly, the extension region CPP may be applied with the first power source ELVDD having a fixed or constant voltage. Thus, the extension region CPP may effectively prevent coupling between the first transistor T1 and the first and second sub-data lines Dja and Djb.

A parasitic capacitor may be formed between the first transistor T1 and the first and second sub-data lines Dja and Djb, and a crosstalk between the first second sub-data line Dja and the first transistor T1 or between the second sub-data line Djb and the first transistor T1 may occur due to the parasitic capacitance of the parasitic capacitor. In an embodiment of the invention, the extension region CPP effectively prevents the coupling between the first transistor T1 and the first and second sub-data lines Dja and Djb, such that the parasitic capacitance of the parasitic capacitor between the first transistor T1 and the first and second sub-data lines Dja and Djb may be decreased. Thus, in such an embodiment, the parasitic capacitance is decreased, and the crosstalk between the first transistor T1 and the first and second sub-data lines Dja and Djb is thereby reduced.

In an embodiment of the invention, the extension region CPP may overlap with at least a portion of the third transistor T3, e.g., the second third transistor T3b. In such an embodiment, where the extension region CPP overlaps with the second third transistor T3b, leakage current is effectively prevented from being generated from the third transistor T3 by external light incident into the second third transistor T3b.

The second power supply line PL2 may be connected to a second power supply line PL2 on an adjacent pixel column through a power connection line PLM.

A fourth interlayer insulating layer IL4 may be disposed on the third interlayer insulating layer IL3 to cover the second conductive patterns.

The fourth interlayer insulating layer IL4 may include an organic insulating material. In one embodiment, for example, the fourth interlayer insulating layer IL4 may include at least one of photoresist, polyacrylate resin, epoxy resin, phenolic resin, PA resin, PI resin, unsaturated polyester resin, polyphenylene ether resin, polyphenylene sulfide resin, and BCB resin.

The display element OLED may be disposed on the fourth interlayer insulating layer IL4. The display element OLED may include the first electrode AD, the second electrode CD and the emitting layer EML disposed between the first electrode AD and the second electrode CD.

The first electrode AD may be disposed on the fourth interlayer insulating layer IL4. The first electrode AD may be connected to the second bridge pattern BRP2 through the twelfth contact hole CH12 defined through the fourth interlayer insulating layer IL4. Therefore, the first electrode AD may be electrically connected to the first bridge pattern BRP1. Since the first bridge pattern BRP1 is connected to the sixth drain electrode DE6 through the seventh contact hole CH7, the first electrode AD may be electrically connected to the sixth drain electrode DE6.

A pixel defining layer PDL defining a light emitting region to correspond to each pixel PXL may be disposed on the substrate SUB to cover the first electrode AD and the like. The pixel defining layer PDL may expose a top surface of the first electrode AD therethrough and protrude from the substrate SUB along the circumference of the pixel PXL.

The emitting layer EML may be disposed in the light emitting region surrounded by the pixel defining layer PDL, and the second electrode CD may be disposed on the emitting layer EML. An encapsulation layer SLM covering the second electrode CD may be disposed on the second electrode CD.

One of the first electrode AD and the second electrode CD may be an anode electrode, and the other of the first electrode AD and the second electrode CD may be a cathode electrode. In one embodiment, for example, the first electrode AD may be an anode electrode, and the second electrode CD may be a cathode electrode.

In an embodiment, at least one of the first electrode AD and the second electrode CD may be a transmissive electrode. In an embodiment, where the display element OLED is a bottom-emission organic light emitting diode, the first electrode AD may be a transmissive electrode, and the second electrode CD is a reflective electrode. In an alternative embodiment, where the display element OLED is a top-emission organic light emitting diode, the first electrode AD may be a reflective electrode, and the second electrode CD may be a transmissive electrode. In another alternative embodiment, where the display element OLED is a dual-emission organic light emitting diode, both of the first electrode AD and the second electrode CD may be transmissive electrodes. Hereinafter, for convenience of description, an embodiment, where the display element OLED is a top-emission organic light emitting diode, and the first electrode AD is an anode electrode will be described in detail.

The first electrode AD may include a reflective layer (not shown) capable of reflecting light and a transparent conductive layer (not shown) disposed on the top or bottom of the reflective layer. At least one of the transparent conductive layer and the reflective layer may be electrically connected to the sixth drain electrode DE6.

The reflective layer may include a material capable of reflecting light. In one embodiment, for example, the reflective layer may include at least one selected from aluminum (Al), silver (Ag), chromium (Cr), molybdenum (Mo), platinum (Pt), nickel (Ni), and an alloy thereof.

The transparent conductive layer may include a transparent conductive oxide. In one embodiment, for example, the transparent conductive layer may include at least one transparent conductive oxide selected from indium tin oxide ("ITO"), indium zinc oxide ("IZO"), aluminum zinc oxide ("AZO"), gallium doped zinc oxide ("GZO"), zinc tin oxide ("ZTO"), gallium tin oxide ("GTO"), and fluorine doped tin oxide ("FTO").

The pixel defining layer PDL may include an organic insulating material. In one embodiment, for example, the pixel defining layer PDL may include at least one of polystyrene, polymethylmethacrylate ("PMMA"), polyacrylonitrile ("PAN"), PA, PI, polyarylether ("PAE"), heterocyclic polymer, parylene, epoxy, BCB, siloxane based resin, and silane based resin.

The emitting layer EML may be disposed on the exposed surface of the first electrode AD. The emitting layer EML may have a multi-layered thin film structure at least including a light generation layer ("LGL"). In one embodiment, for example, the emitting layer EML may include a hole injection layer ("HIL") for injecting holes, a hole transport layer ("HTL") having a high hole transporting property, the HTL for increasing the opportunity for holes and electrons to be re-combined by suppressing the movement of electrons that fail to be combined in the LGL, the LGL for emitting light through the re-combination of the injected electrons and holes, a hole blocking layer ("HBL") for suppressing the movement of holes that fail to be combined in the LGL, an electron transport layer ("ETL") smoothly transporting electrons to the LGL, and an electron injection layer ("EIL") for injecting electrons. In the emitting layer EML, the HIL, HTL, HBL, ETL and EIL may be common layers commonly disposed in the first to fourth pixels PXL1 to PXL4, which are adjacent to one another.

The second electrode CD may be a semi-transmissive reflective layer. In one embodiment, for example, the second electrode CD may be a thin metal layer having a thickness, which is determined to allow light emitted through the emitting layer EML to be transmitted therethrough. The second electrode CD may transmit a portion of the light emitted from the emitting layer EML therethrough, and may reflect the remaining portion of the light emitted from the emitting layer EML.

The second electrode CD may include a material having a lower work function than the transparent conductive layer. In one embodiment, for example, the second electrode CD may be include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and an alloy thereof.

A portion of the light emitted from the emitting layer EML may not be transmitted through the second electrode CD, and the light reflected from the second electrode CD may be again reflected from the reflective layer. Accordingly, the light emitted from the emitting layer EML may resonate between the reflective layer and the second electrode CD. The light extraction efficiency of the display elements OLED may be improved by the resonance of the light.

The distance between the reflective layer and the second electrode CD may be determined based on a color of the light emitted from the emitting layer EML. In an embodiment, the distance between the reflective layer and the second electrode CD may be adjusted to correspond to a resonance distance, depending on a color of the light emitted from the emitting layer EML.

The encapsulation layer SLM may effectively prevent oxygen and moisture from infiltrating into the organic light emitting diode OLED. The encapsulation layer SLM may include a plurality of inorganic layers (not shown) and a plurality of organic layers (not shown). In one embodiment, for example, the encapsulation layer SLM may include a plurality unit encapsulation layers including the inorganic layer and the organic layer disposed on the inorganic layer. In an embodiment, the inorganic layer may be disposed at the uppermost portion of the encapsulation layer SLM. The inorganic layer may include at least one selected from silicon oxide, silicon nitride, silicon oxynitride, aluminum oxide, titanium oxide, zirconium oxide, and tin oxide.

The second pixel PXL2, the third pixel PXL3 and the fourth pixel PXL4 may have a stack structure similar to that of the first pixel PXL1, except data lines, scan lines, and emission control lines, which are connected thereto.

The second pixel PXL2 may be connected to the second sub-data line Djb out of the j-th data lines Dja and Djb, the (k+1)-th scan line Sk+1, and the (k+1)-th emission control line Ek+1.

The third pixel PXL3 may be connected to the second sub-data line Dj+1b out of the (j+1)-th data lines Dj+1a and Dj+1b disposed in or directly on the same layer as the first sub-data line Dja out of the j-th data lines Dja and Djb, the k-th scan line Sk, and the k-th emission control line Ek.

The fourth pixel PXL4 may be connected to the first sub-data line Dj+1a out of the (j+1)-th data lines Dj+1a and Dj+1b, the (k+1)-th scan line Sk+1, and the (k+1)-th emission control line Ek+1.

Figure 10:
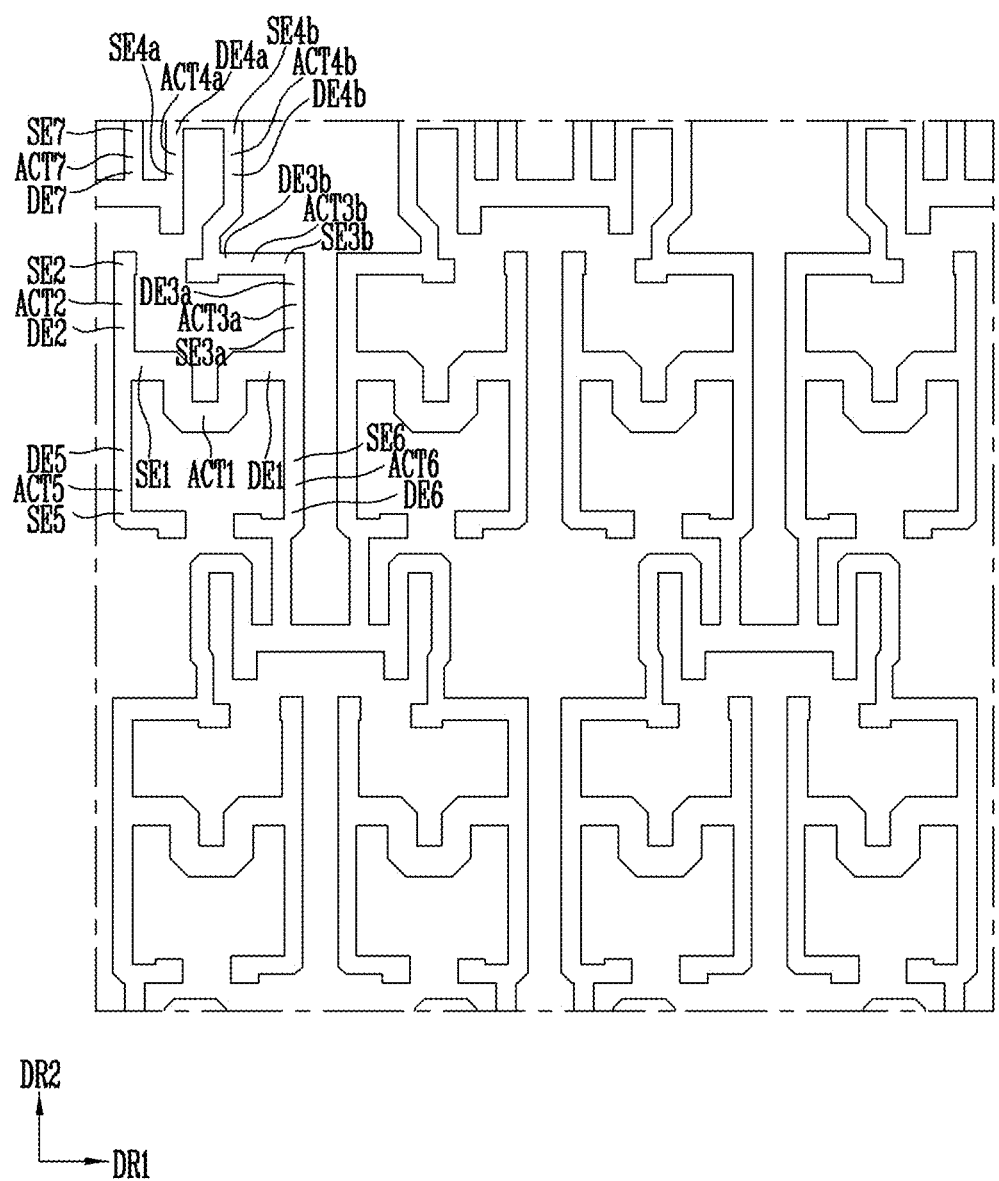
FIG. 10 is a plan view illustrating active patterns, source electrodes, and drain electrodes, shown in FIGS. 4 to 9.
Figure 11:
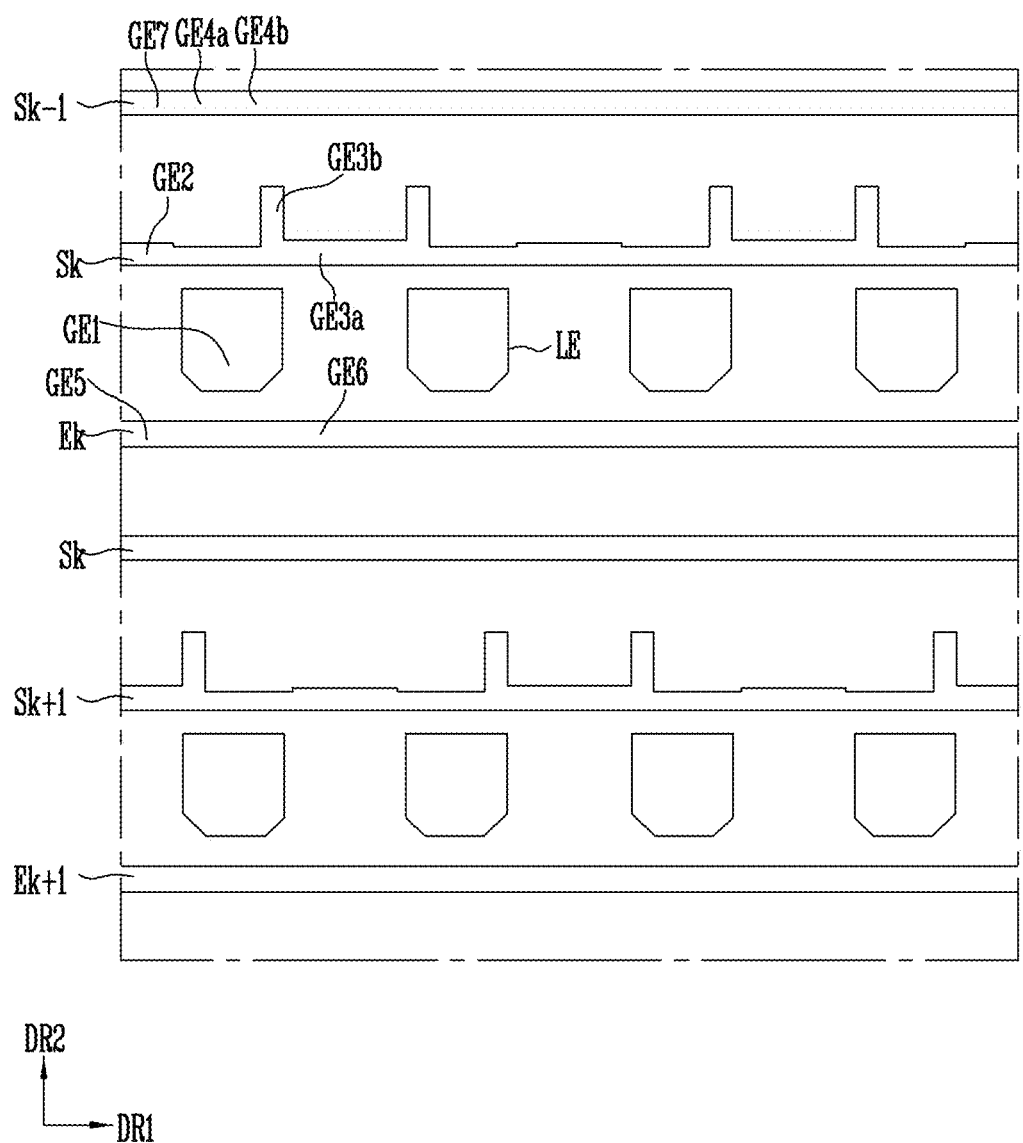
FIG. 11 is a plan view illustrating scan lines, emission control lines, and a lower electrode of a storage capacitor, shown in FIGS. 4 to 9.
Figure 12:
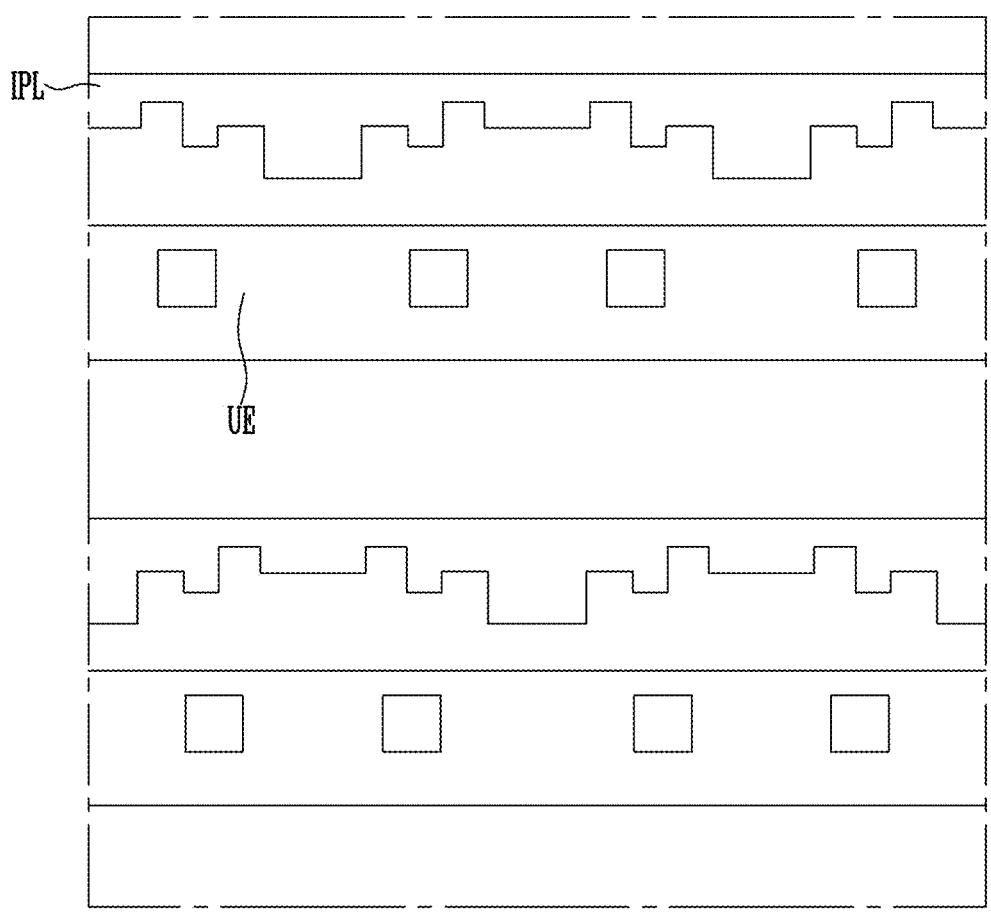
FIG. 12 is a plan view illustrating an initialization power line and an upper electrode of the storage capacitor, shown in FIGS. 4 to 9.
Figure 13:
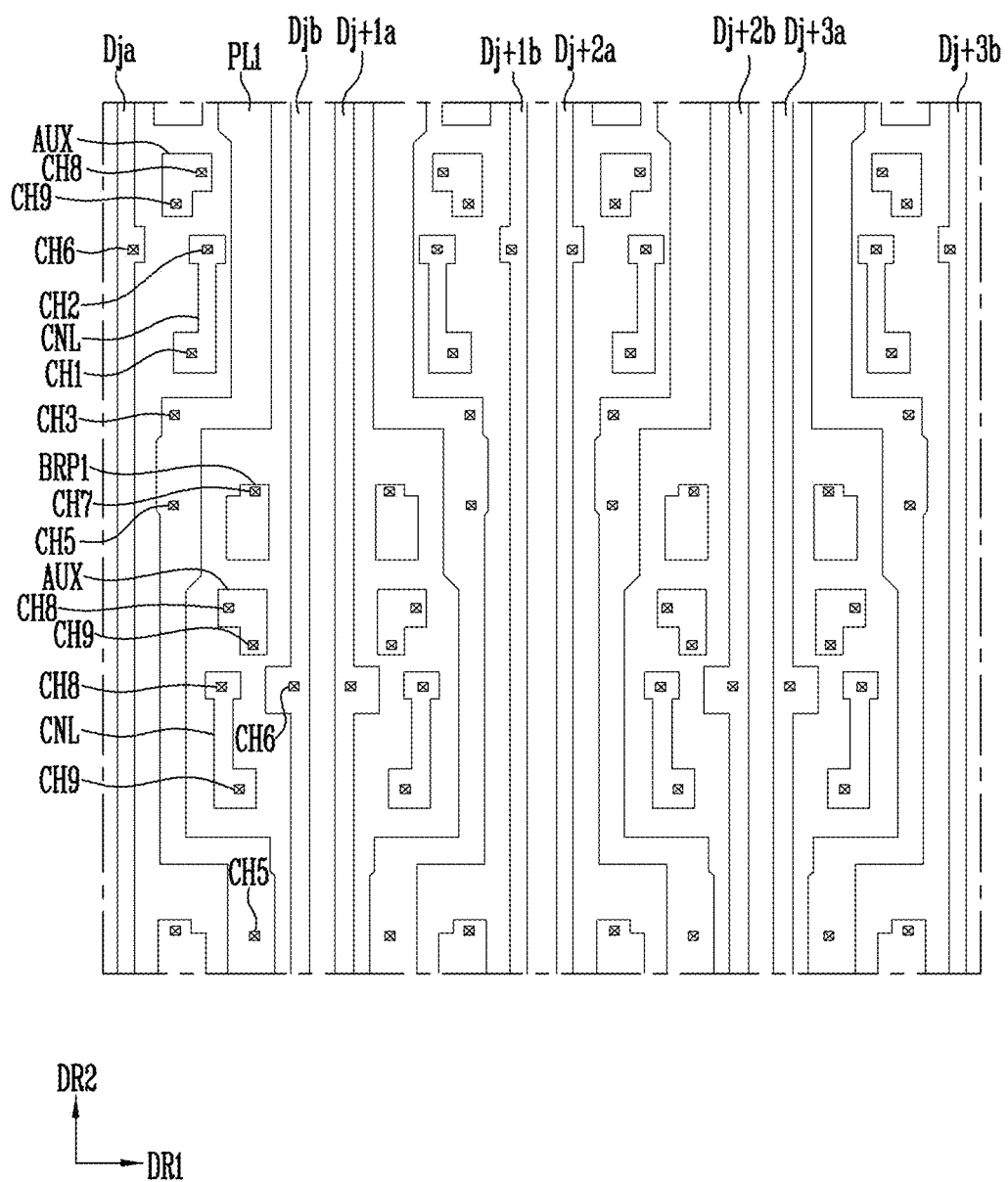
FIG. 13 is a plan view illustrating data lines, a connection line, an auxiliary connection line, a first power supply line of a power line, and a first bridge pattern, shown in FIGS. 4 to 9.
Figure 14:
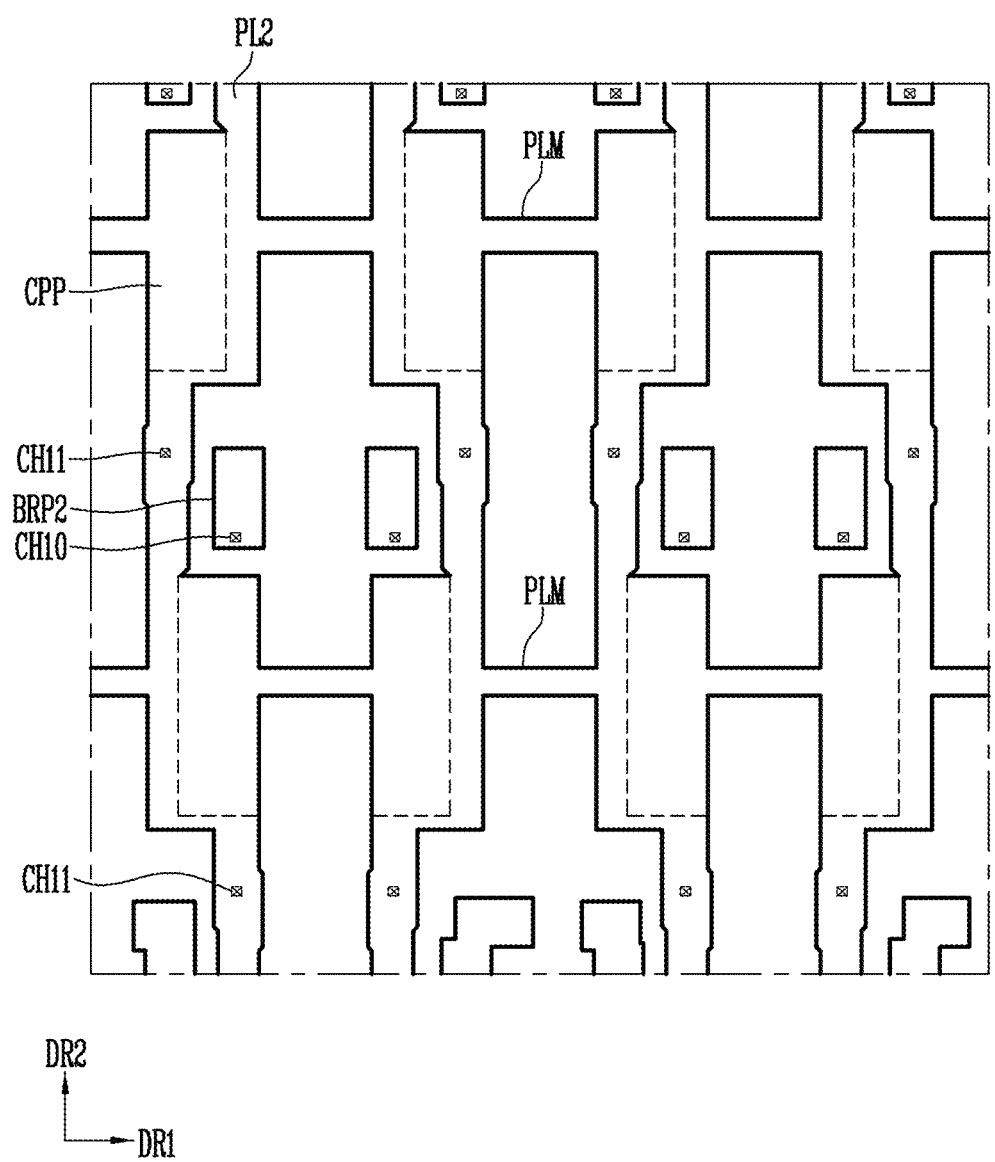
FIG. 14 is a plan view illustrating the data lines, a second power supply line of the power line, a power connection line, an extension region, and a second bridge pattern, shown in FIGS. 4 to 9.
Figure 15:
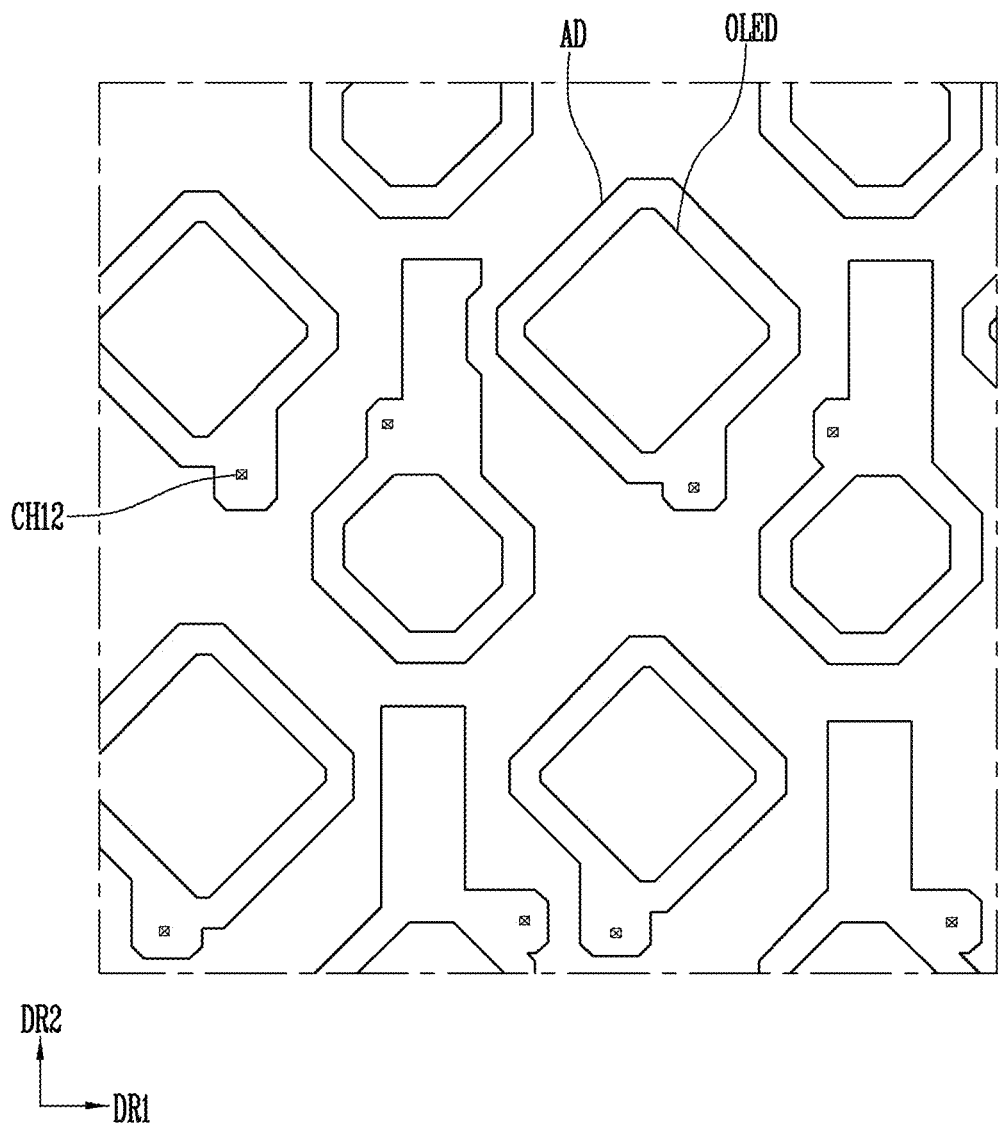
FIG. 15 is a plan view illustrating a display element shown in FIGS. 4 to 9.

FIG. 10 is a plan view illustrating the active patterns, the source electrodes and the drain electrodes, shown in FIGS. 4 to 9. FIG. 11 is a plan view illustrating the scan lines, the emission control lines, and the lower electrode of the storage capacitor, shown in FIGS. 4 to 9. FIG. 12 is a plan view illustrating the initialization power line and the upper electrode of the storage capacitor, shown in FIGS. 4 to 9. FIG. 13 is a plan view illustrating the data lines, the connection line, the auxiliary connection line, the first power supply line of the power line, and the first bridge pattern, shown in FIGS. 4 to 9. FIG. 14 is a plan view illustrating the data lines, the second power supply line of the power line, the power connection line, the extension region, and the second bridge pattern, shown in FIGS. 4 to 9. FIG. 15 is a plan view illustrating the display element shown in FIGS. 4 to 9.

In FIGS. 10 to 15, for convenience of illustration, components of pixels in the k-th pixel row, the (k+1)-th pixel row, the j-th pixel column, the (j+1)-th pixel column, the (j+2)-th pixel column, and the (j+3)-th pixel column are illustrated for each layer.

Referring to FIGS. 2 to 15, the first to seventh active patterns ACT1 to ACT7, the first to seventh source electrodes SE1 to SE7, and the first to seventh drain electrodes DE1 to DE7 may be disposed or provided on the substrate SUB. In an exemplary embodiment, the first to seventh active patterns ACT1 to ACT7, the first to seventh source electrodes SE1 to SE7, and the first to seventh drain electrodes DE1 to DE7 may include a same material as each other and be formed through a same process as each other. The first to seventh source electrodes SE1 to SE7, and the first to seventh drain electrodes DE1 to DE7 may include a semiconductor material.

One end of the first active pattern ACT1 may be connected to the first source electrode SE1, and the other end of the first active pattern ACT1 may be connected to the first drain electrode DE1. One end of the second active pattern ACT2 may be connected to the second source electrode SE2, and the other end of the second active pattern ACT2 may be connected to the second drain electrode DE2. One end of the third active pattern ACT3 may be connected to the third source electrode SE3, and the other end of the third active pattern ACT3 may be connected to the third drain electrode DE3. One end of the fourth active pattern ACT4 may be connected to the fourth source electrode SE4, and the other end of the fourth active pattern ACT4 may be connected to the fourth drain electrode DE4. One end of the fifth active pattern ACT5 may be connected to the source electrode SE5, and the other end of the fifth active pattern ACT5 may be connected to the fifth drain electrode DE5. One end of the sixth active pattern ACT6 may be connected to the sixth source electrode SE6, and the other end of the sixth active pattern ACT6 may be connected to the sixth drain electrode DE6. One end of the seventh active pattern ACT7 may be connected to the seventh source electrode SE7, and the other end of the seventh active pattern ACT7 may be connected to the seventh drain electrode DE7.

The (k−1)-th scan line Sk−1, the k-th scan line Sk, the (k+1)-th scan line, the k-th emission control line Ek, the (k+1)-th emission control line Ek+1, and the first to seventh gate electrodes GE1 to GE7 may be disposed or provided on the gate insulating layer GI on the first to seventh active patterns ACT1 to ACT7. The (k−1)-th scan line Sk−1, the k-th scan line Sk, the (k+1)-th scan line, the k-th emission control line Ek, the (k+1)-th emission control line Ek+1, and the first to seventh gate electrodes GE1 to GE7 may include a same material as each other and be formed through a same process as each other.

In the k-th pixel row, the (k−1)-th scan line Sk−1, the k-th scan line Sk, the k-th emission control line Ek, and the first to seventh gate electrodes GE1 to GE7 may be disposed or provided on the gate insulating layer GI. The first gate electrode GE1 may define the lower electrode LE of the storage capacitor Cst. The second gate electrode GE2 and the third gate electrode GE3 may be integrally formed as a single unitary unit with the k-th scan line Sk. The fourth gate electrode GE4 and the seventh gate electrodes GE7 may be integrally formed as a single unitary unit with the (k−1)-th scan line Sk−1. The fifth gate electrode GE5 and the sixth gate electrode GE6 may be integrally formed as a single unitary unit with the k-th emission control line Ek.

In the (k+1)-th pixel row, the k-th scan line Sk, the (k+1)-th scan line Sk+1, the (k+1)-th emission control line Ek+1, and the first to seventh gate electrodes GE1 to GE7 may be disposed or provided on the gate insulating layer GI. The second gate electrode GE2 and the third gate electrode GE3 may be integrally formed as a single unitary unit with the (k+1)-th scan line Sk+1. The fourth gate electrode GE4 and the seventh gate electrode GE7 may be integrally formed as a single unitary unit with the k-th scan line Sk. The fifth gate electrode GE5 and the sixth gate electrode GE6 may be integrally formed as a single unitary unit with the (k+1)-th emission control line Ek+1.

The upper electrode UE of the storage capacitor Cst and the initialization power line IPL may be disposed or provided on the first interlayer insulating layer IL1 provided on the (k−1)-th scan line Sk−1, the k-th scan line Sk, the (k+1)-th scan line Sk+1, the k-th emission control line Ek, the (k+1)-th emission control line Ek+1, and the first to seventh gate electrodes GE1 to GE7. The initialization power line IPL and the upper electrode UE may include a same material as each other and be formed through a same process as each other.

A data pattern, the connection line CNL, the auxiliary connection line AUX, the first bridge pattern BRP1, and the first power supply line PL1 of the power line PL may be disposed or provided on the second interlayer insulating layer IL2 provided on the initialization power line IPL and the upper electrode UE. The first data pattern, the auxiliary connection line AUX, the first bridge pattern BRP1, and the first power supply line PL1 may include the same material and be formed through the same process.

The data pattern may include the j-th data lines Dja and Djb, the (j+1)-th data lines Dj+1a and Dj+1b, the (j+2)-th data lines Dj+2a and Dj+2b, and the (j+3)-th data lines Dj+3a and Dj+3b. In the k-th pixel row and the (k+1)-th pixel row, the j-th data lines Dja and Djb, the (j+1)-th data lines Dj+1a and Dj+1b, the (j+2)-th data lines Dj+2a and Dj+2b, and the (j+3)-th data lines Dj+3a and Dj+3b may be connected to the second source electrode SE2 through the sixth contact hole CH6 defined through the gate insulating layer GI, the first interlayer insulating layer IL1 and the second interlayer insulating layer IL2.

The first sub-data lines Dja, Dj+1a, Dj+2a, and Dj+3a and the second sub-data lines Djb, Dj+1b, Dj+2b, and Dj+3b of the j-th data lines Dja and Djb, the (j+1)-th data lines Dj+1a and Dj+1b, the (j+2)-th data lines Dj+2a and Dj+2b, and the (j+3)-th data lines Dj+3a and Dj+3b may be disposed at both sides of pixel columns, respectively. In one embodiment, for example, the first sub-data line Dja and the second sub-data line Djb of the j-th data lines Dja and Djb may be disposed at both sides of the j-th pixel column, respectively. The first sub-data line Dj+1a and the second sub-data line Dj+1b of the (j+1)-th data lines Dj+1a and Dj+1b may be disposed at both sides of the (j+1)-th pixel column, respectively. The first sub-data line Dj+2a and the second sub-data line Dj+2b of the (j+2)-th data lines Dj+2a and Dj+2b may be disposed at both side of the (j+2)-th pixel column, respectively. The first sub-data line Dj+3a and the second sub-data line Dj+3b of the (j+3)-th data lines Dj+3a and Dj+3b may be disposed at both sides of the (j+3)-th pixel column, respectively.

In such an embodiment, two sub-data lines, i.e., the first sub-data line Dja, Dj+1a, Dj+2a, or Dj+3a and the second sub-data line Djb, Dj+1b, Dj+2b, and Dj+3b may be disposed or provided between two pixel columns adjacent to each other. In one embodiment, for example, the second sub-data line Djb out of the j-th data lines Dja and Djb and the first sub-data line Dj+1a out of the (j+1)-th data lines Dj+1a and Dj+1b may be disposed between the j-th pixel column and the (j+1)-th pixel column. The second sub-data line Dj+1b out of the (j+1)-th data lines Dj+1a and Dj+1b and the first sub-data line Dj+2a out of the (j+2)-th data lines Dj+2a and Dj+2b may be disposed between the (j+1)-th pixel column and the (j+2)-th pixel column. The second sub-data line Dj+2b out of the (j+2)-th data lines Dj+2a and Dj+2b and the first sub-data line Dj+3a out of the (j+3)-th data lines Dj+3a and Dj+3b may be disposed between the (j+2)-th pixel column and the (j+3)-th pixel column.

In such an embodiment, two sub-data lines Dja, Djb, Dj+1a, Dj+1b, Dj+2a, Dj+2b, Dj+3a, and Dj+3b adjacent to each other among sub-data lines Dja, Djb, Dj+1a, Dj+1b, Dj+2a, Dj+2b, Dj+3a, and Dj+3b connected to two pixel columns adjacent to each other may be connected to pixels in a same pixel row, as described above. Two sub-data lines Djb and Dj+1a adjacent to each other among four sub-data lines Dja, Djb, Dj+1a, and Dj+1b connected to the j-th pixel column and the (j+1)-th pixel column may be connected to pixels in a same pixel row, e.g., the (k+1)-th pixel row. Two sub-data lines Dj+1b and Dj+2a adjacent to each other among four sub-data lines Dj+1a, Dj+1b, Dj+2a, and Dj+2b connected to the (j+1)-th pixel column and the (j+2)-th pixel column may be connected to pixels in a same pixel row, e.g., the k-th pixel row. Two sub-data lines Dj+2b and Dj+3a adjacent to each other among four sub-data lines Dj+2a, Dj+2b, Dj+3a, and Dj+3b connected to the (j+2)-th pixel column and the (j+3)-th pixel column may be connected to pixels in a same pixel row, e.g., the (k+1)-th pixel row.

In such an embodiment, two sub-data lines Dja, Djb, Dj+1a, Dj+1b, Dj+2a, Dj+2b, Dj+3a, and Dj+3b located most distant from each other among sub-data lines Dja, Djb, Dj+1a, Dj+1b, Dj+2a, Dj+2b, Dj+3a, and Dj+3b connected to two pixel columns adjacent to each other may be connected to pixels in a same pixel row, as described above. Two sub-data lines Dja and Dj+1b located most distant from each other among four sub-data lines Dja, Djb, Dj+1a, and Dj+1b connected to the j-th pixel column and the (j+1)-th pixel column may be connected to pixels in a same pixel row, e.g., the k-th pixel row. Two sub-data lines Dj+1a and Dj+2b located most distant from each other among four sub-data lines Dj+1a, Dj+1b, Dj+2a, and Dj+2b connected to the (j+1)-th pixel column and the (j+2)-th pixel column may be connected to pixels in a same pixel row, e.g., the (k+1)-th pixel row. Two sub-data lines Dj+2a and Dj+3b located most distant from each other among four sub-data lines Dj+2a, Dj+2b, Dj+3a, and Dj+3b connected to the (j+2)-th pixel column and the (j+3)-th pixel column may be connected to pixels in a same pixel row, e.g., the k-th pixel row.

The first power supply lines PL1 may extend in parallel to one of the data lines Dja, Djb, Dj+1a, Dj+1b, Dj+2a, Dj+2b, Dj+3a, and Dj+3b and the scan lines Sk−1, Sk, and Sk+1, e.g., the data lines Dja, Djb, Dj+1a, Dj+1b, Dj+2a, Dj+2b, Dj+3a, and Dj+3b. The first power supply lines PL1 may be connected to the upper electrode UE through the third contact CH defined through the second interlayer insulating layer IL2. In such an embodiment, the first power supply lines PL1 may be connected to the fifth source electrode SE5 through the fifth contact hole CH5 defined through the gate insulating layer GI, the first interlayer insulating layer IL1, and the second interlayer insulating layer IL2.

The connection line CNL may be connected to the first gate electrode GE through the first contact hole CH1 defined through the first interlayer insulating layer IL1 and the second interlayer insulating layer IL2. Also, the connection line CNL may be connected to the third drain electrode DE3 and the fourth drain electrode DE4 through the second contact hole CH2 defined through the gate insulating layer GI, the first interlayer insulating layer IL1, and the second interlayer insulating layer IL2.

The auxiliary connection line AUX may be connected to the initialization power line ILP through the eighth contact hole CH8 defined through the second interlayer insulating layer IL2. In such an embodiment, the auxiliary connection line AUX may be connected to the seventh drain electrode DE7 through the ninth contact hole CH9 defined through the gate insulating layer GI, the first interlayer insulating layer IL1, and the second interlayer insulating layer IL2.

The first bridge pattern BRP1 may be connected to the sixth drain electrode DE6 through the seventh contact hole CH7 defined through the gate insulating layer GI, the first interlayer insulating layer IL1, and the second interlayer insulating layer IL2.

The second power supply lines PL2 of the power line PL, the power connection lines PLM, the extension region CPP, and the second bridge pattern BRP2 may be disposed or provided on the third interlayer insulating layer IL3 provided on the first data pattern, the connection line CNL, the auxiliary connection line AUX, the first bridge pattern BRP1, and the first power supply lines PL1. The second power supply lines PL2, the power connection lines PLM, the extension region CPP, and the second bridge pattern BRP2 may include a same material as each other, and be formed through a same process as each other.

The second bridge pattern BRP2 may be connected to the first bridge pattern BRP1 through the tenth contact hole CH10 defined through the third interlayer insulating layer IL3.

At least some of the second power supply lines PL2 may overlap with the first power supply lines PL1. The second power supply lines PL2 may extend in parallel to one of the data lines Dja, Djb, Dj+1a, Dj+1b, Dj+2a, Dj+2b, Dj+3a, and Dj+3b and the scan lines Sk−1, Sk, and Sk+1, e.g., the data lines Dja, Djb, Dj+1a, Dj+1b, Dj+2a, Dj+2b, Dj+3a, and Dj+3b.

The second power supply lines PL2 may be connected to the first power supply lines PL1 through the eleventh contact holes CH11 defined through the third interlayer insulating layer IL3. In one embodiment, for example, the eleventh contact holes CH11 may be disposed in regions in which the first power supply lines PL1 and the second power supply lines PL2 overlap with each other, and the first power supply lines PL1 and the second power supply lines PL2 may be electrically connected to each other through the eleventh contact holes CH11.

The extension region CPP may be defined by an extending portion from a portion of the second power supply line PL2. The extension region CPP may overlap with at least a portion of the first transistor T1, the connection line CNL, and at least a portion of the third transistor T3.

The power connection lines PLM may connect second power supply lines PL2 adjacent to each other, e.g., second power supply lines PL2 of pixel columns adjacent to each other. Therefore, the second power supply lines PL2 adjacent to each other may be electrically connected by the power connection lines PLM. The power connection lines PLM may be disposed or provided in or directly on the same layer as the second power supply lines PL2. In one embodiment, for example, the second power supply lines PL2 and the power connection lines PLM may be provided on the third interlayer insulating layer IL3. In such an embodiment, the power connection lines PLM may include a same material as the second power supply lines PL2, and be formed through a same process as the second power supply lines PL2. The power connection lines PLM may intersect the data lines Dja, Djb, Dj+1a, Dj+1b, Dj+2a, Dj+2b, Dj+3a, and Dj+3b provided on the second interlayer insulating layer IL2.

In an exemplary embodiment, as described above, the first power supply lines PL1 and the second power supply lines PL2 may be disposed or provided on layers different from each other, and be connected to each other through the eleventh contact hole CH11. In such an embodiment, the second power supply lines PL2 may be disposed or provided on the third interlayer insulating layer IL3, and second power supply lines PL2 adjacent to each other may be connected through the power connection lines PLM. Thus, in such an embodiment, the power line PL including the first power supply lines PL1 and the second power supply lines PL2 is connected in a mesh form, thereby effectively preventing a voltage drop of the first power source ELVDD. In such an embodiment, the voltage drop of the first power source ELVDD is effectively prevented, such that the first power source ELVDD may be uniformly supplied to the pixels PXL1, PXL2, PXL3, and PXL4, and the quality of the display device may be prevented from being deteriorated.

The display element OLED may be disposed or provided on the fourth interlayer insulating layer IL4 provided on the second power supply lines PL2, the power connection lines PLM, the extension region CPP, and the second bridge pattern BRP2. The display element OLED may include the first electrode AD on the fourth interlayer insulating layer IL4, the emitting layer EML on the first electrode AD, and the second electrode CD on the emitting layer EML.

The first electrode AD may be connected to the second bridge pattern BRP2 through the twelfth contact hole CH12 defined through the fourth interlayer insulating layer IL4.

As described above, in an exemplary embodiment of the display device according to the disclosure, a parasitic capacitor is effectively prevented from being formed between the driving transistor in each pixel and adjacent data lines, and thus, a vertical crosstalk is effectively prevented from occurring in the display device. As a result, the display quality of the display device is improved.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the disclosure as set forth in the following claims.

What is claimed is:

1. A display device comprising:
   a plurality of pixels substantially in a matrix form including a plurality of pixel columns arranged along a first direction, and a plurality of pixel rows arranged along a second direction intersecting the first direction;
   a plurality of data lines connected to the pixel columns, respectively; and
   a power line to supply a driving power voltage to at least some of the plurality of pixels,
   wherein each of the data lines comprises:
   a first sub-data line disposed at a side of a corresponding pixel column; and
   a second sub-data line disposed at an opposite side of the corresponding pixel column, and
   wherein the power line comprises:
   a first power supply line disposed on a first layer extending in a pixel column direction; and
   a second power supply line disposed on a second layer different from the first layer and extending in the pixel column direction,
   wherein the second power supply line is electrically connected to the first power supply line, and
   wherein the second power supply line extending along the pixel column direction overlaps a substantial length defining the first power supply line extending along the pixel column direction.

2. The display device of claim 1, further comprising:
   a plurality of scan lines to supply scan signals to the plurality of pixels,
   wherein each of the plurality of pixels comprises:
   a display element;
   a first transistor connected to a first node and configured to control an amount of current supplied to the display element, the first transistor including a gate electrode;

a second transistor connected between one of the plurality of data lines and the first node, the second transistor including a gate electrode connected to one of the scan lines; and a third transistor connected to the gate electrode of the first transistor, the third transistor including a gate electrode connected to one of the scan lines, wherein the power line overlaps at least a portion of the gate electrode of the first transistor.

3. The display device of claim 2, wherein the power line is disposed on a different layer from the data lines.

4. The display device of claim 2, wherein the portion that the power line overlaps at least the portion of the gate electrode of the first transistor is disposed between the first sub-data line and the second sub-data line.

5. The display device of claim 2, wherein at least a portion of a connection line that connects the gate electrode of the first transistor and an electrode of the third transistor overlaps the power line.

6. The display device of claim 2, wherein the first transistor further comprises:
an active pattern disposed on a substrate;
a source electrode connected to the active pattern;
a drain electrode connected to the active pattern; and
an interlayer insulating layer comprising a first interlayer insulating layer, a second interlayer insulating layer and a third interlayer insulating layer,
wherein the gate electrode of the first transistor overlaps the active pattern with a gate insulating layer interposed therebetween, and
wherein the first interlayer insulating layer, the second interlayer insulating layer and the third interlayer insulating layer cover the gate electrode and are sequentially stacked one on another.

7. The display device of claim 6, further comprising:
a storage capacitor comprising a lower electrode disposed on the gate insulating layer and an upper electrode disposed on the first interlayer insulating layer,
wherein at least a portion of the storage capacitor overlaps the power line and the active pattern of the first transistor.

8. The display device of claim 6, wherein the power line comprises:
the first power supply line disposed on the second interlayer insulating layer; and
the second power supply line disposed on the third interlayer insulating layer.

9. The display device of claim 8, wherein the power line further comprises an extension region having a shape extending from the second power supply line.

10. The display device of claim 8, wherein at least a portion of the active pattern overlaps the power line.

11. The display device of claim 2, wherein the gate electrode of the second transistor and the gate electrode of the third transistor are connected to the same scan line.

12. A display device comprising:
a plurality of pixels substantially in a matrix form including a plurality of pixel columns arranged along a first direction, and a plurality of pixel rows arranged along a second direction intersecting the first direction;
a plurality of data lines connected to the pixel columns, respectively;
a power line to supply a driving power voltage to at least some of the plurality of pixels; and
a plurality of scan lines to supply scan signals to the plurality of pixels, wherein each of the data lines comprises:
a first sub-data line disposed at a side of a corresponding pixel column; and
a second sub-data line disposed at an opposite side of the corresponding pixel column, and
wherein the power line comprises:
a first power supply line disposed on a first layer; and
a second power supply line disposed on a second layer different from the first layer,
wherein the second power supply line is electrically connected to the first power supply line,
wherein each of the plurality of pixels comprises:
a display element;
a first transistor connected to a first node and configured to control an amount of current supplied to the display element, the first transistor including a gate electrode;
a second transistor connected between one of the plurality of data lines and the first node, the second transistor including a gate electrode connected to one of the scan lines; and
a third transistor connected to the gate electrode of the first transistor, the third transistor including a gate electrode connected to one of the scan lines,
wherein the power line overlaps at least a portion of the gate electrode of the first transistor,
wherein the third transistor further comprises:
an active pattern disposed on a substrate;
a source electrode connected to the active pattern;
a drain electrode connected to the active pattern; and
an interlayer insulating layer comprising a first interlayer insulating layer, a second interlayer insulating layer and a third interlayer insulating layer,
wherein the gate electrode of the third transistor overlaps the active pattern with a gate insulating layer interposed therebetween, and
wherein the first interlayer insulating layer, the second interlayer insulating layer and the third interlayer insulating layer cover the gate electrode and are sequentially stacked one on another.

13. A display device comprising:
a first pixel column comprising first pixels arranged along a first direction;
a second pixel column comprising second pixels arranged along the first direction and spaced apart from the first pixel column in a second direction intersecting the first direction; and
data lines connected to the first and second pixel columns,
wherein the data lines comprise:
a first sub-data line disposed between the first and second pixel columns and connected to some of the first pixels;
a second sub-data line disposed between the first sub-data line and the second pixel column and connected to some of the second pixels; and
a power line to supply a driving power voltage to at least some of the first and second pixels,
wherein semiconductor patterns of the first pixels have a first shape symmetrical with a second shape of semiconductor patterns of the second pixels, and
wherein the power line comprises:
a first power supply line disposed on a first layer extending in a pixel column direction; and
a second power supply line disposed on a second layer different from the first layer and extending in the pixel column direction,
wherein the second power supply line is electrically connected to the first power supply line, and wherein the second power supply line extending along the pixel column direction overlaps a substantial length defining the first power supply line extending in the pixel column direction.

14. The display device of claim 13, wherein the first sub-data line and the second sub-data line extend in the first direction with an imaginary line extending in the first direction interposed therebetween.

15. The display device of claim 13, wherein:
the data lines further comprise a third sub-data line and a fourth sub-data line;
the third sub-data line is disposed at a first side of the first pixel column;
the first sub-data line is disposed at a second side of the first pixel column opposite to the first side of the first pixel column;
the second sub-data line is disposed at a first side of the second pixel column; and
the fourth sub-data line is disposed at a second side of the second pixel column opposite to the first side of the second pixel column.

16. The display device of claim 15, wherein:
the first pixels comprise a third pixel and a fourth pixel arranged in the first direction;
the second pixels comprise a fifth pixel and a sixth pixel arranged in the first direction;
the third sub-data line is connected to the third pixel;
the first sub-data line is connected to the fourth pixel;
the second sub-data line is connected to the sixth pixel; and
the fourth sub-data line is connected to the fifth pixel.

17. The display device of claim 16, wherein semiconductor patterns of the third and fourth pixels have a symmetrical shape with the semiconductor patterns of the fifth and sixth pixels.

18. The display device of claim 13, further comprising:
a plurality of scan lines to supply scan signals to the first pixels and the second pixels,
wherein one of the first pixels and the second pixels comprises:
a display element;
a first transistor connected to a first node and configured to control an amount of current supplied to the display element, the first transistor including a gate electrode;
a second transistor connected between one of the plurality of data lines and the first node, the second transistor including a gate electrode connected to one of the scan lines; and
a third transistor connected to the gate electrode of the first transistor, the third transistor including a gate electrode connected to one of the scan lines,
wherein the power line overlaps at least a portion of the gate electrode of the first transistor.

19. The display device of claim 18, wherein at least a portion of a connection line that connects the gate electrode of the first transistor and an electrode of the third transistor overlaps the power line.

20. The display device of claim 13, wherein the power line is disposed on a different layer from the data lines.

* * * * *